United States Patent
Emoto

(10) Patent No.: US 6,810,298 B2
(45) Date of Patent: Oct. 26, 2004

(54) TEMPERATURE ADJUSTMENT APPARATUS, EXPOSURE APPARATUS HAVING THE TEMPERATURE ADJUSTMENT APPARATUS, AND SEMICONDUCTOR DEVICE MANUFACTURING METHOD

(75) Inventor: Keiji Emoto, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 134 days.

(21) Appl. No.: 09/824,799

(22) Filed: Apr. 4, 2001

(65) Prior Publication Data

US 2001/0055102 A1 Dec. 27, 2001

(30) Foreign Application Priority Data

Apr. 7, 2000 (JP) ........................................ 2000-105855

(51) Int. Cl.$^7$ ............................................. G05D 23/00
(52) U.S. Cl. ........................... 700/121; 700/19; 700/77; 700/121; 165/206
(58) Field of Search ............................. 702/56; 700/95, 700/96, 121; 355/30, 46, 77, 153, 55

(56) References Cited

U.S. PATENT DOCUMENTS

| | | | | | |
|---|---|---|---|---|---|
| 4,720,732 A | * | 1/1988 | Tsutsui | ........................ | 355/30 |
| 5,134,436 A | * | 7/1992 | Fujioka | ........................ | 355/30 |
| 5,481,170 A | * | 1/1996 | Edelen et al. | ................ | 318/650 |
| 5,577,552 A | * | 11/1996 | Ebinuma et al. | ............... | 355/30 |
| 5,610,965 A | * | 3/1997 | Mori et al. | ..................... | 355/30 |
| 5,778,386 A | * | 7/1998 | Lin et al. | ..................... | 700/121 |
| 6,226,073 B1 | | 5/2001 | Emoto | ......................... | 355/53 |

FOREIGN PATENT DOCUMENTS

| JP | 7-302124 | 11/1995 |
|---|---|---|
| JP | 7-302747 | 11/1995 |

\* cited by examiner

*Primary Examiner*—Paul Rodriguez
(74) *Attorney, Agent, or Firm*—Fitzpatrick, Cella, Harper & Scinto

(57) ABSTRACT

A temperature adjustment apparatus for adjusting a temperature of an object to be temperature-controlled. The apparatus includes a first temperature adjustment mechanism for controlling the temperature of the object to be temperature-controlled, and a second temperature adjustment mechanism for controlling the temperature of the object to be temperature-controlled. The first and second temperature adjustment mechanisms have different temperature control responses, and control the temperature of the object to be temperature-controlled in cooperation with coarse adjustment and fine adjustment on the basis of a difference in response. Also, the first temperature adjustment mechanism and the second temperature adjustment mechanism are operatively connected so that the output of the first temperature adjustment mechanism controls the operation of the second temperature adjustment mechanism.

25 Claims, 14 Drawing Sheets

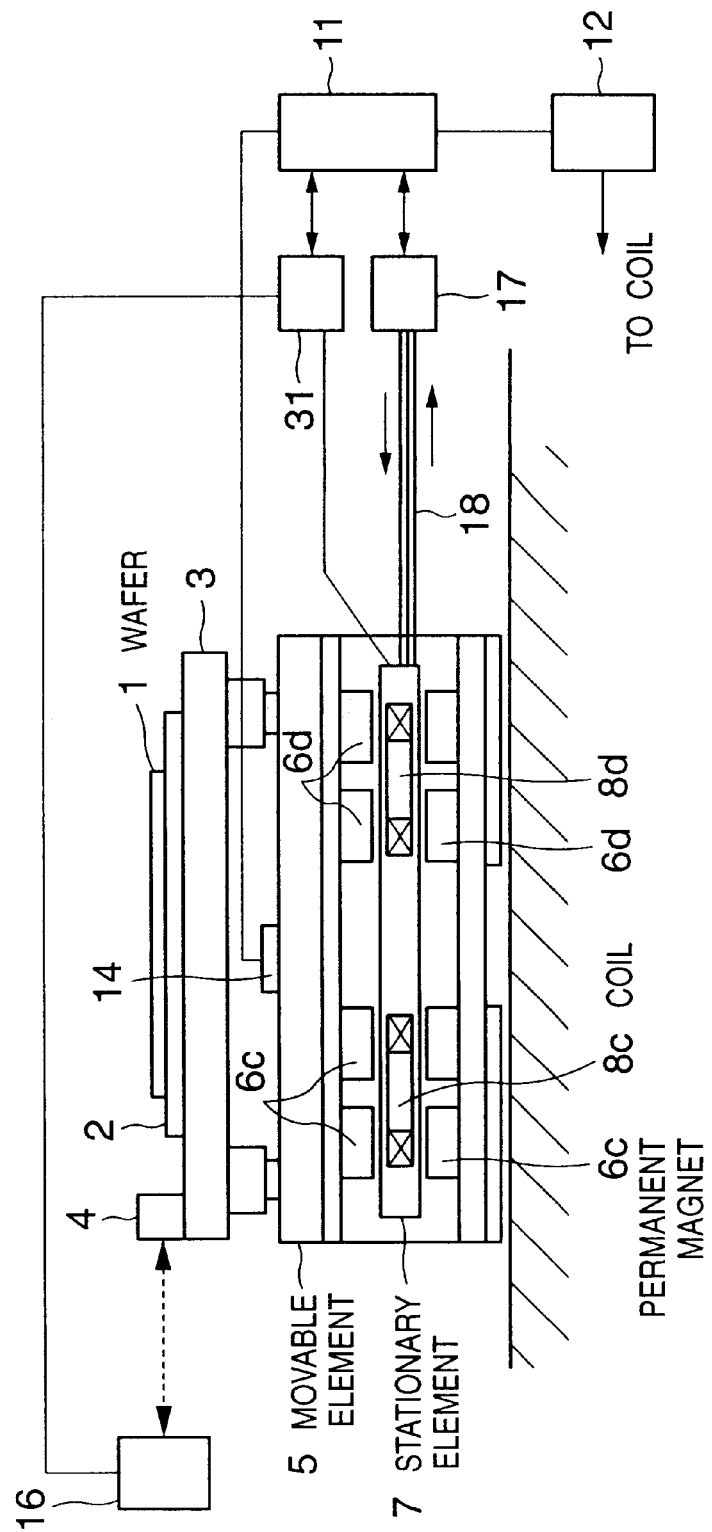

FIG. 11

```
URL  [http://www···············]
TROUBLE DB INPUT WINDOW

INPUT
TYPE OF APPARATUS  [* * * * * * * * *]~401
SUBJECT  [OPERATION ERROR (START-UP ERROR)]~403
SERIAL NUMBER S/N  [465NS···]~402
DEGREE OF URGENCY  [D]~405
SYMPTOM   [LED KEEPS ON FLICKERING
           AFTER POWER-ON              ]~406

REMEDY    [POWER ON AGAIN
           (PRESS RED BUTTON IN ACTIVATION)]~407

PROGRESS  [INTERIM HAS BEEN DONE       ]~408

[SEND] [RESET]      410              411                412
LINK TO RESULT LIST DATABASE   SOFTWARE LIBRARY   OPERATING GUIDE
```

TEMPERATURE ADJUSTMENT APPARATUS, EXPOSURE APPARATUS HAVING THE TEMPERATURE ADJUSTMENT APPARATUS, AND SEMICONDUCTOR DEVICE MANUFACTURING METHOD

FIELD OF THE INVENTION

The present invention relates to a temperature adjustment apparatus in, e.g., an alignment stage apparatus such as an exposure apparatus or a high-precision processing apparatus requiring precise alignment, an exposure apparatus having the temperature adjustment apparatus, and a semiconductor device manufacturing method.

BACKGROUND OF THE INVENTION

A projection exposure apparatus (e.g., a stepper or the like) used in photolithography for manufacturing a semiconductor element, liquid crystal display element, or the like, transfers at a high precision a pattern formed on a master such as a reticle or photomask onto a substrate such as a wafer or glass plate coated with a photoresist via a projection optical unit. For this purpose, very high imaging characteristics are demanded for the projection optical unit, and a high measurement precision is demanded for, e.g., a laser interferometer for measuring the alignment of a stage which supports a substrate such as a master or wafer.

The imaging characteristics of the projection optical unit and the measurement precision of the laser interferometer are greatly influenced by changes in apparatus and ambient temperatures. The laser interferometer causes fluctuations of a laser beam upon a change in ambient temperature, degrading the measurement precision.

At the same time, a member holding a mirror as a measurement target of the laser interferometer deforms owing to the temperature change, the relative alignment of a substrate and the mirror serving as an alignment reference change, and the measurement precision decreases. Recently, demands have arisen for an alignment precision of a nanometer (nm) order. For example, even if a 100-mm thick low-temperature thermal expansion member (thermal expansion coefficient: $1\times10^{-6}$) deforms by 100 nm upon a temperature change of 1° C., and the air temperature on the laser path of the laser interferometer changes by 1° C., the alignment measurement value may change by 100 nm depending on conditions. Hence, the temperatures of the building components of the projection exposure apparatus and its ambient temperature must be kept constant.

In a conventional projection exposure apparatus, a temperature rise of the apparatus by a heating member such as an exposure light source or a driving motor for driving a stage degrades the measurement precision of, e.g., the laser interferometer for measuring the stage alignment and the imaging characteristics of the projection optical unit.

In some cases, a temperature change of air changes the ambient temperature of the projection exposure apparatus, degrading the imaging characteristics of the projection optical unit. To prevent this, global air-conditioning is generally performed in which the projection exposure apparatus is stored in an environment control chamber, and temperature-controlled air is supplied into the chamber.

An exposure apparatus requiring precise temperature management undergoes temperature management by a combination of global air-conditioning and a method of directly supplying a temperature-controlled coolant such as air or water to a portion to be cooled. For example, to keep the measurement precision of the laser interferometer constant, air controlled to a predetermined temperature in a predetermined direction is supplied into a local space in the optical path of a laser beam between the laser interferometer and a mirror for reflecting a laser beam from the laser interferometer. To recover and remove heat generated by, e.g., a driving motor for driving a reticle stage or wafer stage, a cooling circulation pipe surrounds the driving motor, and a coolant such as water, air, or an inert liquid is circulated from an external temperature adjustment apparatus to the circulation pipe.

The temperature is controlled by setting a temperature sensor at or near a portion to be temperature-controlled, changing the flow rate or temperature of a coolant on the basis of an output from the temperature sensor, and adjusting the heat recovery amount (see Japanese Patent Laid-Open Nos. 7-302124 and 7-302747).

FIG. 14 is a view schematically showing an example of the driving device of an alignment stage in a conventional exposure apparatus. A wafer 501 is held by a top plate 503 of an alignment stage via a wafer chuck 502. A pattern formed on a master (not shown) such as a reticle is transferred onto the wafer 501 by irradiation light from an illumination optical unit (not shown) via a projection lens (not shown). The alignment stage aligns the wafer by relatively moving linear motors made up of a movable element 505 to which permanent magnets 506 are fixed and a stationary element 507 in which a plurality of coils 508 are buried, in accordance with driving signals from a controller 511 and driver 512. The movable element 505 is guided by hydrostatic bearings 524 and connected to linear motors 526 for vertical movement. The top plate 503 is set via the movable element 505 and linear motors 526. The stationary element 507 has a plurality of coils 508 and is constituted by a jacket structure so as to flow a coolant for recovering heat generated by the coils 508.

A mirror 504 is attached to the top plate 503, and the alignment of the top plate 503 is measured by an alignment measurement unit 516 such as a laser interferometer fixed to an alignment position where the unit 516 faces the mirror 504. A measurement value from the alignment measurement unit 516 is sent to the controller 511. The controller 511 controls the energization amount to the coil 508 of each linear motor via the driver 512 on the basis of the measurement value, drives and controls the linear motor, and drives and aligns the alignment stage at a high precision.

The stationary element 507 is connected to a coolant pipe 518 for circulating a coolant temperature-managed by a cooling unit 517, in order to prevent heat generated by each coil 508 upon driving the linear motor from conducting to air or a member and increasing the temperatures of the top plate 503 and wafer 501. The temperature-managed coolant drains heat generated by the coil 508 and is recovered by the cooling unit 517 outside the driving device. To compensate for the temperature, a temperature control unit 513 receives temperature data from a temperature measurement unit 515 for outputting temperature data measured by a temperature sensor 514 set on the movable element 505, and instructs the cooling unit 517 to control the temperature or flow rate of the coolant so as to minimize temperature changes of the movable element 505 and top plate 503. In addition, the temperature control unit 513 supplies to the linear motors via the coolant pipe 518 a coolant which is managed in temperature and adjusted in flow rate by the cooling unit 517. The temperature-managed coolant absorbs heat generated by the linear motor stationary element 507, and suppresses temperature changes of the movable element 505, top plate 503, and wafer 501.

In this prior art, to precisely manage the temperatures of a plurality of heating portions, ① a necessary amount of coolant temperature-controlled in accordance with the respective heating portions is supplied to the heating portions, or ② a coolant of the same temperature is supplied to all the heating portions after the flow rate is secured such that the coolant temperature after absorbing heat generated by all the heating portions is equal to or smaller than the allowable rise temperature of the apparatus. In ①, the pipe for supplying the coolant is complicated. Particularly to manage the temperature of the wafer stage or the like, problems such as a load resistance to driving due to the pipe rigidity and a location ensured to lay out the pipe must be solved. For example, to individually control the temperatures or flow rates of the respective linear motors when the linear motors have different driving patterns, the number of cooling units must be increased as the number of linear motors increases. Also, the number of coolant pipes extending from the cooling units to the alignment stage increases.

However, the number of pipes and their diameter are limited because a disturbance to alignment caused by the flexural rigidity or vibrations of the pipe must be suppressed. It is not, therefore, practical to arrange cooling units equal in number to the linear motors, individually lay out pipes from the respective cooling units to the respective linear motors, and control coolant amounts to the respective linear motors. For this reason, a given number of linear motors is set as one group, like ②, and controlled at the same coolant temperature or flow rate by using one cooling unit. It is difficult to execute precise temperature control for each linear motor. In this method, the cooling amount of the coolant is determined in correspondence with a portion having the largest heat generation amount, and an unwanted cooling amount (flow rate or temperature) of the coolant is inefficiently supplied to another heating portion having a small heat generation amount.

To rapidly cope with a change in the heat amount of a heating element such as a coil, there is proposed a method of predicting the heat amount of the heating element by a temperature control unit and controlling the heat recovery amount of a coolant. The coolant pipe extending from the cooling unit 517 to each linear motor is as long as 5 m or more. Thus, (1) even if the coolant temperature is controlled, a long time is taken to reflect the coolant temperature on each linear motor, and temperature control is delayed. (2) Even if the coolant temperature is controlled by the cooling unit 517 at a high precision, a high-precise temperature is not reflected when the coolant reaches the linear motor owing to movement of heat during a long pipe. (3) A large time lag occurs because the cooling unit 517 cannot change the coolant temperature as fast as an output from the linear motor. These problems make it difficult to perform high-precision temperature control for objects to be temperature-controlled such as a top plate and a substrate including a wafer to be aligned.

If the temperature is controlled based on an output from the temperature sensor, the output from the temperature sensor is changed after the temperature changes, so high-response temperature control cannot be achieved as a whole. Furthermore, attaching the temperature sensor increases cost and decreases reliability.

As an output from a recent exposure apparatus increases, the heat amount of each driving portion increases. It becomes difficult for the conventional method to ensure a coolant flow rate at which all generated heat is recovered and a temperature rise of a coolant is suppressed to be smaller than the allowable temperature difference of the apparatus. In other words, to ensure a high coolant flow rate, the pipe must be made thick under limitations on the pump ability or the like. Such a pipe is difficult to lay out. In addition, the thick pipe acts as a nonlinear driving load resistance with respect to an alignment driving portion and degrades the alignment precision.

Vibrations caused by the flow of a coolant along with an increase in coolant flow rate cannot be ignored and may adversely influence an alignment precision, which must be high. A coolant having a large heat capacity may be used to recover generated heat without excessively increasing the coolant flow rate. However, there is no coolant having a heat capacity with which heat generated by the driving unit of the exposure apparatus or the like can be recovered at a proper flow rate.

As described above, heat generated in the exposure apparatus has conventionally been recovered to suppress a temperature rise in order to suppress a temperature change in the apparatus. If heat generated in the entire exposure apparatus increases, the conventional method cannot completely recover the generated heat, and each portion of the apparatus inevitably changes in temperature. Even if generated heat can be completely recovered, the alignment precision degrades, which is in conflict with the purpose of increasing the alignment precision.

SUMMARY OF THE INVENTION

The present invention has been proposed to solve the conventional problems, and has as its object to provide a temperature adjustment apparatus capable of controlling the temperature of an exposure apparatus or the like at a high precision with a simple arrangement and high response, to provide a high-precision, high-reliability exposure apparatus which suppresses changes in apparatus and ambient temperature even if heat generated in the apparatus increases along with an increase in output of the entire exposure apparatus, and suppresses decreases in alignment measurement precision, alignment precision, and imaging characteristics caused by a temperature change, and to provide a semiconductor device manufacturing method.

To achieve the above object, according to the present invention, there is provided a temperature adjustment apparatus for adjusting a temperature of an object to be temperature-controlled, comprising a first temperature adjustment mechanism for controlling the temperature of the object to be temperature-controlled, and a second temperature adjustment mechanism for controlling the temperature of the object to be temperature-controlled, wherein the first and second temperature adjustment mechanisms have different temperature control responses, and control the temperature of the object to be temperature-controlled in cooperation with the coarse adjustment and fine adjustment on the basis of a difference in response.

In the temperature adjustment apparatus of the present invention, the object to be temperature-controlled preferably includes an actuator or a member near the actuator.

In the temperature adjustment apparatus of the present invention, the object to be temperature-controlled may include a plurality of objects to be temperature-controlled. The second temperature adjustment mechanism can serially connect the plurality of objects to be temperature-controlled and adjust temperatures. Also, the second temperature adjustment mechanism can adjust, in parallel, temperatures of the plurality of objects to be temperature-controlled.

In the temperature adjustment apparatus of the present invention, the first temperature adjustment mechanism preferably controls the temperature of the object to be temperature-controlled on the basis of prediction of the temperature of the object to be temperature-controlled. The first temperature adjustment mechanism preferably comprises a Peltier element arranged at or near the object to be temperature-controlled.

In the temperature adjustment apparatus of the present invention, the second temperature adjustment mechanism preferably recovers heat of the object to be temperature-controlled by using a coolant temperature-controlled by a cooling unit.

In the temperature adjustment apparatus of the present invention, the first temperature adjustment mechanism preferably comprises a third temperature adjustment mechanism for adjusting a temperature of a heat exhaust portion. The third temperature adjustment mechanism can serve as part of the second temperature adjustment mechanism.

According to the present invention, there is provided a temperature adjustment apparatus for adjusting temperatures of a plurality of objects to be temperature-controlled, comprising a plurality of first temperature adjustment mechanisms which are respectively arranged at the plurality of objects to be temperature-controlled and respectively control the temperatures of the objects to be temperature-controlled, and a second temperature adjustment mechanism for recovering heat exhausted from the plurality of first temperature adjustment mechanisms at once.

In the temperature adjustment apparatus of the present invention, the objects to be temperature-controlled preferably include actuators or members near the actuators.

In the temperature adjustment apparatus of the present invention, the first temperature adjustment mechanisms preferably control the temperatures of the objects to be temperature-controlled on the basis of prediction of the temperatures of the objects to be temperature-controlled. The first temperature adjustment mechanisms preferably comprise Peltier elements respectively arranged at the objects to be temperature-controlled.

In the temperature adjustment apparatus of the present invention, the second temperature adjustment mechanism preferably adjusts temperatures of heat exhaust portions of the first temperature adjustment mechanisms.

According to the present invention, there is provided an alignment stage apparatus, comprising a first temperature adjustment mechanism for controlling a temperature of an object to be temperature-controlled, a second temperature adjustment mechanism for controlling the temperature of the object to be temperature-controlled, the first and second temperature adjustment mechanisms having different temperature control responses, and an actuator for controlling the temperature of the object to be temperature-controlled in cooperation with coarse adjustment and fine adjustment on the basis of a difference in response, and driving the alignment stage by using information about the temperature control as one piece of information for driving control.

According to the present invention, there is provided an exposure apparatus having an illumination optical unit for emitting exposure light, a stage for supporting a substrate, and a main controller for controlling exposure operation of transferring a pattern formed on a master to the substrate, comprising a controller for controlling a Peltier element on the basis of an operation control signal from the main controller, and controlling heat movement by the Peltier element, the Peltier element being set at or near an object to be temperature-controlled.

In the exposure apparatus of the present invention, the controller preferably predicts a heat generation amount or temperature of the object to be temperature-controlled on the basis of the operation control signal from the main controller, and controls the Peltier element.

In the exposure apparatus of the present invention, a heat recovery unit is preferably arranged near the object to be temperature-controlled. The heat recovery unit preferably uses a coolant whose temperature and flow rate are controlled by a cooling unit.

In the exposure apparatus of the present invention, the controller preferably predicts a heat generation amount or temperature of the object to be temperature-controlled on the basis of the operation control signal from the main controller, and controls the Peltier element and/or a heat recovery unit. It is preferable that the main controller include a driving controller for controlling an actuator of the stage, and that the controller control the Peltier element and/or a heat recovery unit on the basis of a stage driving signal from the driving controller.

In the exposure apparatus of the present invention, it is preferable that at least one temperature sensor for measuring a temperature of the object to be temperature-controlled be set, and that the controller control the Peltier element and/or a heat recovery unit on the basis of an output signal from the temperature sensor.

In the exposure apparatus of the present invention, when the object to be temperature-controlled includes a heating element, a heat conduction path between the heating element and the Peltier element is preferably formed from a material higher in thermal conductivity than a material of a non-heat conduction path. The Peltier element is preferably sandwiched between the object to be temperature-controlled and a base member, and the base member is preferably formed from a material having a high thermal conductivity and a large heat capacity.

According to the present invention, there is provided an exposure apparatus having an illumination optical unit for emitting exposure light, a stage for supporting a substrate, and a main controller for controlling exposure operation of transferring a pattern formed on a master to the substrate, comprising a heat generation amount controller for controlling a heat generation amount of a heating element in accordance with an operation status of the exposure apparatus, the heating element being set near at least part of an object to be temperature-controlled.

In the exposure apparatus of the present invention, the heating element is preferably set near a heating element of the object to be temperature-controlled.

When the exposure apparatus of the present invention comprises a linear motor with a plurality of coils as actuators of the stage, a coil not participating in the exposure operation can be used as the heating element. An actuator of the stage can include actuators larger by at least one than at least one degree of freedom, and each of the actuators can be used as the heating element.

In the exposure apparatus of the present invention, a heat recovery unit for recovering a heat generation amount or adjusting a temperature is preferably disposed near the object to be temperature-controlled. The heat recovery unit can use a coolant whose temperature and flow rate are controlled by a cooling unit. The heat recovery unit is preferably controlled based on the heat generation amount of the heating element.

In the exposure apparatus of the present invention, the heat generation amount controller preferably controls the heat generation amount of the heating element on the basis of a heat generation amount recovered by a heat recovery unit. The heat generation amount controller preferably sets an initial heat generation amount for the heating element. The initial heat generation amount can be set from a difference between a maximum heat generation amount generated from a heating element of the object to be temperature-controlled and a maximum heat recovery amount of a heat recovery unit.

In the exposure apparatus of the present invention, the heat generation amount controller preferably controls the heat generation amount of the heating element on the basis of an exposure signal from the main controller. The heat generation amount controller preferably predicts a heat generation amount or temperature of the exposure apparatus on the basis of an exposure signal from the main controller, and controls the heat generation amount of the heating element so as to reduce a temperature change of the exposure apparatus.

In the exposure apparatus of the present invention, it is preferable that at least one temperature sensor for measuring a temperature of the object to be temperature-controlled be set, and that the heat generation amount controller control the heat generation amount of the heating element on the basis of an output signal from the temperature sensor.

In the exposure apparatus of the present invention, it is preferable that the main controller include an exposure amount controller for controlling an exposure amount of the illumination optical unit, and that the heat generation amount controller control the heat generation amount of the heating element on the basis of a signal from the exposure amount controller.

In the exposure apparatus of the present invention, the exposure apparatus preferably further comprises a display, a network interface, and a computer for executing network access software, and maintenance information of the exposure apparatus is communicated via a computer network.

The network access software preferably provides on the display a user interface for accessing a maintenance database provided by a vendor or user of the exposure apparatus, and enables obtaining information from the database via the internet or a dedicated network connected to the computer network.

According to the present invention, there is provided a semiconductor device manufacturing method comprising the steps of installing manufacturing apparatuses for performing various processes, including the above-described exposure apparatus, in a semiconductor manufacturing factory, and manufacturing a semiconductor device in a plurality of processes by using the manufacturing apparatuses.

The device manufacturing method of the present invention preferably further comprises the steps of connecting the manufacturing apparatuses by a local area network, and communicating information about at least one of the manufacturing apparatuses between the local area network and the Internet or a dedicated network serving as an external network of the semiconductor manufacturing factory. It is preferable that a database provided by a semiconductor device manufacturer or a supplier of the exposure apparatus be accessed by data communication via the external network to obtain maintenance information of the manufacturing apparatus, or production management be done by data communication between the semiconductor manufacturing factory and another semiconductor manufacturing factory via the external network.

According to the present invention, there is provided a semiconductor manufacturing factory comprising manufacturing apparatuses for performing various processes, including the above-described exposure apparatus, a local area network for connecting the manufacturing apparatuses in the semiconductor manufacturing factory, and a gateway for enabling accessing the Internet or a dedicated network serving as an external network of the semiconductor manufacturing factory from the local area network, wherein information of at least one of the manufacturing apparatuses can be communicated.

According to the present invention, the Peltier element near the object to be temperature-controlled is controlled based on exposure operation of an exposure apparatus or the like. This enables heat movement control with good response with respect to the exposure operation, and enables high-precision temperature control which cannot be achieved by the prior art. Since a temperature sensor need not always be employed, a low-cost exposure apparatus with high stability can be implemented. Further, decreases in alignment measurement precision and alignment precision by a temperature change can be suppressed.

The heat recovery unit is arranged near the object to be temperature-controlled. A heat movement amount controlled by the Peltier element can be reduced, the control efficiency of the Peltier element can be increased, and heat generated by the Peltier element itself can be suppressed to be small. As a result, an increase in total heat amount to be recovered can be suppressed.

The heat conduction path between the Peltier element and a heating element is made of a material having a high thermal conductivity. Therefore, the heat movement amount between the Peltier element and the heating element can be increased, and the heat amount of the object to be temperature-controlled can be efficiently controlled. The base member is made of a material having a high thermal conductivity or large heat capacity, so that a heat amount from the object to be temperature-controlled can suppress temperature nonuniformity or a temperature rise of the base member.

The heat generation amount of a heating unit near the object to be temperature-controlled is controlled. Thus, a change in the heat generation amount of the object to be temperature-controlled can be reduced to reduce a change in temperature at each portion of the apparatus and a change in ambient temperature. The heating unit is set near a heating element for the object to be temperature-controlled. The heating unit can give influence equal to influence of the heating element of the driving device on another portion, which facilitates temperature control of each portion of the apparatus.

When a linear motor having a plurality of coils is used as a stage driving unit, a coil not participating in exposure operation or the like is used as a heating unit, and no new heating unit need be arranged. Moreover, two or more driving units are arranged in one driving direction, and the driving force and heat generation amount in this driving direction are arbitrarily changed. With this arrangement, each driving unit can be used as a heating unit, and no new heating unit need be arranged, which is advantageous in terms of installation space and cost.

The heat recovery unit is adopted together with control of the heat generation amount of the heating unit. Even if the heat generation amount of each driving portion increases along with an increase in output from the entire apparatus, temperature changes of the apparatus and atmosphere can be suppressed. A temperature change can be controlled at a relatively low temperature, and decreases in measurement precision and alignment precision by a temperature change can be suppressed.

The heat generation amount of the heating unit is controlled on the basis of exposure operation of the exposure apparatus and a heat generation amount recovered by the heat recovery unit. The heating state of the apparatus can be accurately grasped, and thus the heat generation amount can be appropriately controlled. By predicting a temperature rise of each portion of the apparatus on the basis of various pieces of information, a proper heat generation amount can be applied to the heating unit, and temperature control can be minimized.

By reflecting the detection result of the temperature at each portion of the apparatus on the heating unit, higher-precision control of a temperature change can be achieved.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 6 is a view schematically showing the driving device of an alignment stage in an exposure apparatus according to the fifth embodiment of the present invention;

FIG. 11 is a view showing an example of a user interface in the input window of a trouble database;

DETAILED DESCRIPTION OF THE PREFERRED EMBODIMENTS

Preferred embodiments of the present invention will now be described in detail in accordance with the accompanying drawings.

<First Embodiment>

The first embodiment of the present invention will be described with reference to FIGS. 1 and 2.

Figure 1:
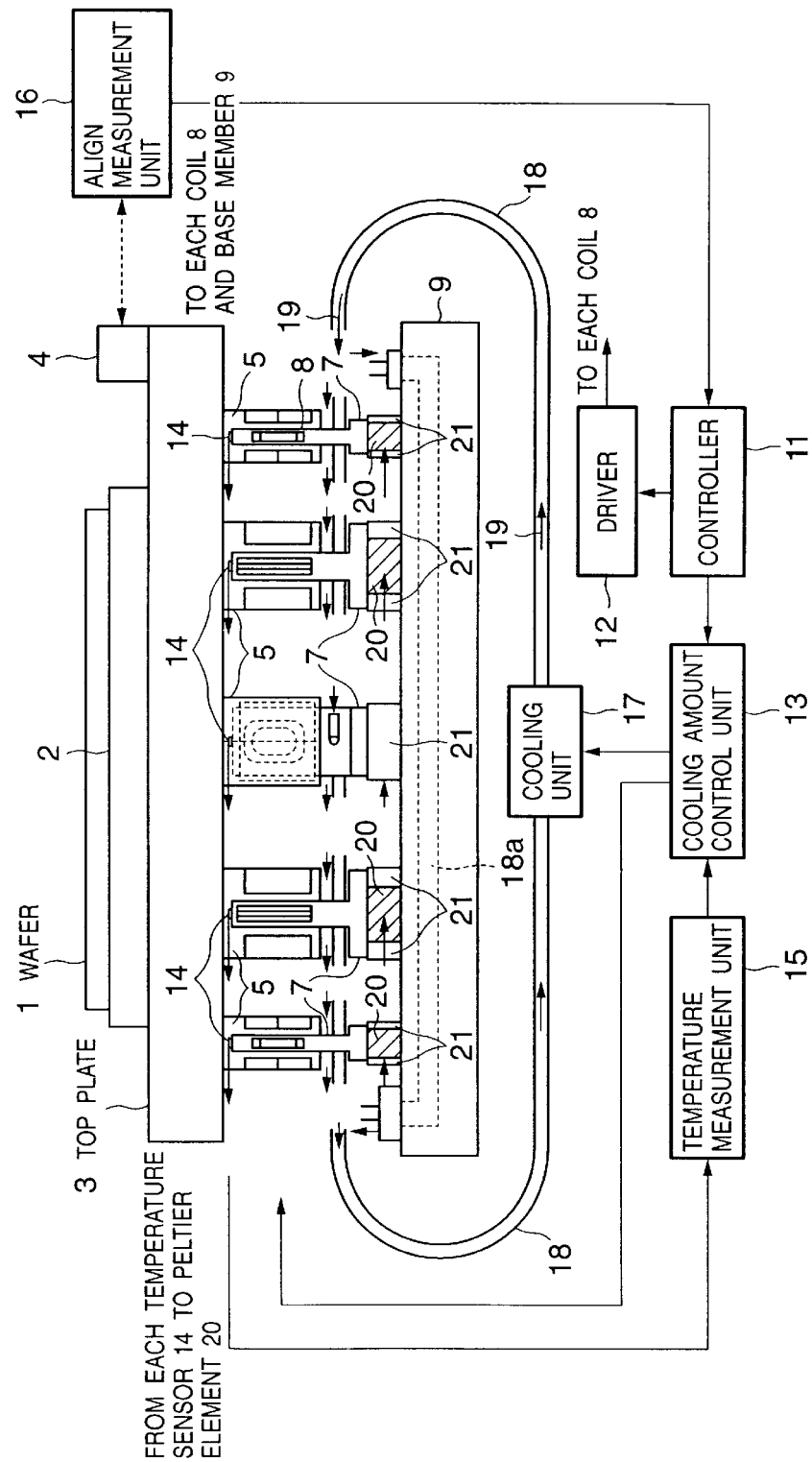
FIG. 1 is a view schematically showing the driving device of a fine alignment stage in an exposure apparatus according to the first embodiment of the present invention.

FIG. 1 is a view schematically showing the driving device of a fine alignment stage in an exposure apparatus according to the first embodiment of the present invention. FIG. 2 is a view showing part of the driving device of the fine alignment stage in the exposure apparatus according to the first embodiment of the present invention, particularly, the structure of a linear motor for driving the fine alignment stage in the Z direction.

Figure 2:
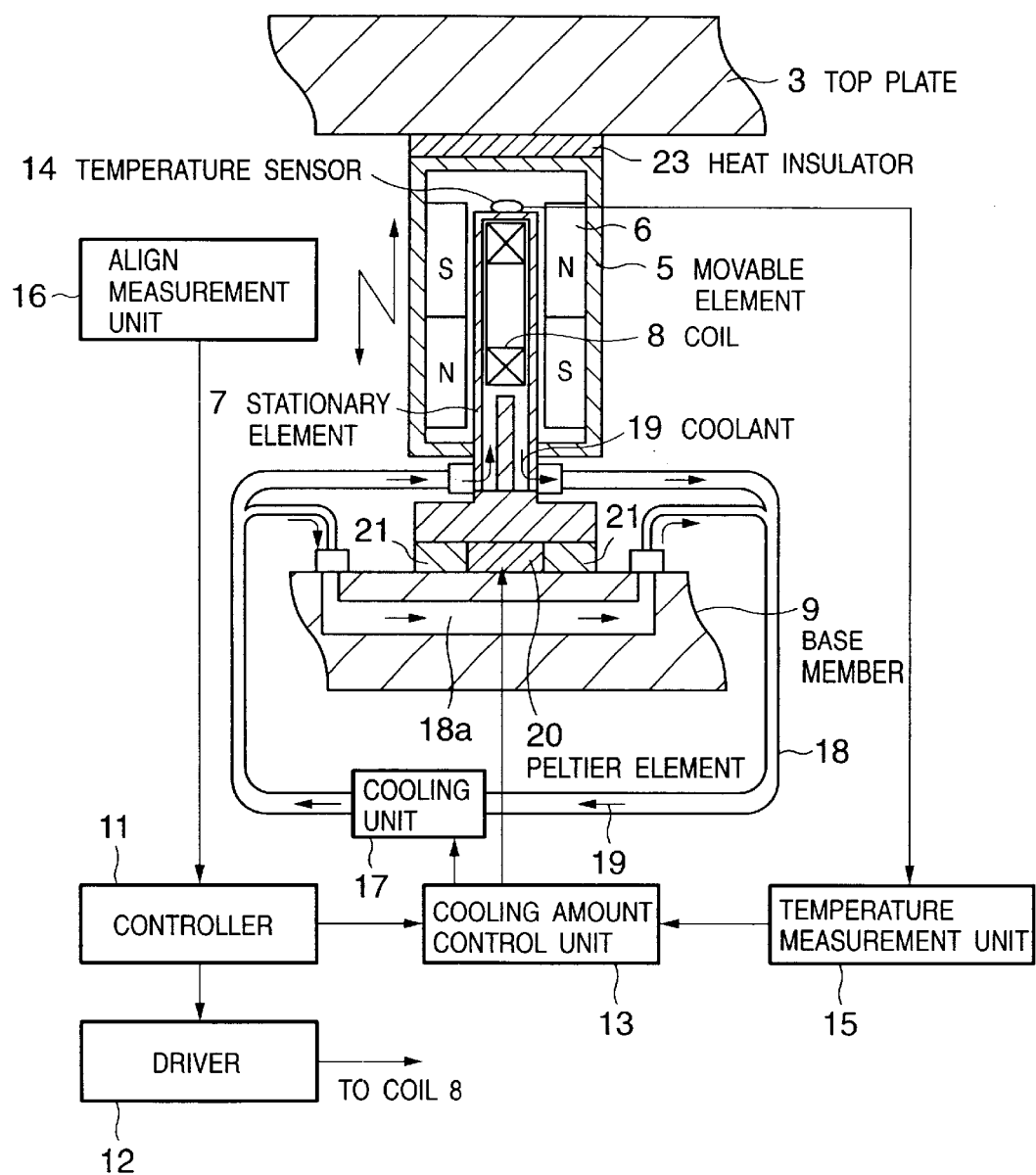
FIG. 2 is a view showing part of the driving device of the fine alignment stage in the exposure apparatus according to the first embodiment of the present invention, particularly, the structure of a linear motor for driving the fine alignment stage in the Z direction.

In FIGS. 1 and 2, a wafer 1 as a substrate is held by a top plate 3 of the fine alignment stage via a wafer chuck 2. A pattern formed on a master (not shown) such as a reticle is transferred onto the wafer 1 by irradiation light from an illumination optical unit (not shown) via a projection lens (not shown).

The fine alignment stage comprises a total of six linear motors (one is not shown), i.e., one (or two depending on the arrangement) linear motor in the X direction, two linear motors in the Y direction, and three linear motors in the Z direction. The six linear motors enable alignment control with a total of six degrees of freedom in the X-, Y-, and Z-axis directions and around the X-, Y-, and Z-axes. The fine alignment stage can precisely align the wafer 1 as an object to be aligned by driving, via a controller 11 and driver 12, the linear motors respectively made up of movable and stationary elements 5 and 7.

Each linear motor allows a permanent magnet (moving magnet) to move. Each movable element 5 to which a permanent magnet 6 (FIG. 2) is fixed is attached to the top plate 3 via a heat insulator 23. A coil 8 of each stationary element 7 is covered with a jacket for flowing a coolant 19. The linear motor stationary element 7 is attached to a base member 9 via a Peltier element 20 and heat insulator 21. The stationary element 7 is fixed to the base member 9 via the heat insulator 21 of ceramics having a high rigidity and low thermal conductivity so as to apply little force on the Peltier element 20 because the Peltier element 20 is generally low in rigidity. The Peltier element 20 moves heat from a high-temperature (heating) side to a low-temperature side by supplying a current or voltage. Heat movement can be controlled at a high speed and high precision by controlling a current or voltage supplied to the Peltier element 20. Since the stationary element 7 is fixed via the heat insulator 21, heat moved between the stationary element 7 and the base member 9 by the Peltier element 20 can be prevented from conducting backward.

To promote heat movement by the Peltier element 20, the stationary element 7 is made of aluminum higher in thermal conductivity than ceramics as the material of a building element such as the heat insulator 23 for fixing the top plate 3 and movable element 5 or the heat insulator 21 for fixing the stationary element 7. Since the stationary element 7 as a main heat path between the coil 8 serving as a heating element and the Peltier element 20 serving as a heat movement controller is made of aluminum having a high thermal conductivity, a larger amount of heat generated by the coil 8 can be moved to the base member 9 while the temperature difference in the stationary element 7 is kept small.

A mirror 4 is attached to the end of the top plate 3 (FIG. 1), and the alignment of the top plate 3 is measured by an alignment measurement unit 16 such as a laser interferometer fixed to an alignment position where the unit 16 faces the mirror 4. A measurement value from the alignment measurement unit 16 is sent to the controller 11. The controller 11 controls the energization amount to each coil 8 via the driver 12 on the basis of the measurement value, controls the linear motor, and drives and aligns the fine alignment stage at a high precision. Note that the controller 11 constitutes a main controller for controlling an exposure operation of the exposure apparatus, and the main controller includes an exposure amount control unit for controlling the exposure amount and exposure conditions of the illumination optical unit, and a driving control unit for controlling driving of each stage.

The stationary element 7 is connected to a coolant pipe 18 for supplying and recovering a coolant temperature-managed by a cooling unit 17, in order to prevent heat generated by the coil 8 upon driving the linear motor from conducting to air or a member and increasing the temperature of the top plate 3. The coolant pipe 18 serially flows the coolant 19 to the respective linear motors. The temperature-managed coolant 19 is supplied to the fine alignment stage and distributed to the stationary elements 7 of the respective linear motors in the stage, as schematically shown in FIG. 1. The coolant 19 absorbs heat generated by the respective coils 8. The coolant 19 having passed through the linear motors is recovered at once by the cooling unit 17 outside the driving device. This arrangement can facilitate layout of the coolant pipe 18 from the cooling unit 17 to the fine alignment stage and simplify the cooling unit 17.

Although it is impossible to perform accurate temperature control of each linear motor by the coolant 19, the first embodiment realizes fine temperature control by each Peltier element 20. According to this method, the coolant pipe 18 connects, in parallel, the linear motors, but may serially connect them to provide high-precision temperature control.

A cooling amount control unit 13 receives data of an energization amount or the like to each coil 8 from the controller 11 for adjusting the energization amount to each coil 8 via the driver 12 and controlling the linear motor. Then, the cooling amount control unit 13 calculates in advance or real time a heat amount generated by each linear motor, and controls the Peltier element 20 and cooling unit 17.

The cooling amount control unit 13 instructs the cooling unit 17 to control the temperature or flow rate of the coolant 19 so as to minimize temperature changes of the stationary element 7 and top plate 3 and to compensate for the temperature with reference to temperature data received from a temperature measurement unit 15 for outputting temperature data measured by a temperature sensor 14 attached to each stationary element 7. In this manner, the cooling amount control unit 13 can control the Peltier element 20 and cooling unit 17, can adjust the temperature of the coolant 19 by the cooling unit 17, and can use the Peltier element 20 to control at a high precision a heat amount which cannot be controlled by only the coolant 19.

In the first embodiment having this arrangement, the controller 11 instructs the driver 12 to align the wafer 1 as an object to be aligned to a predetermined alignment on the basis of measurement data by the alignment measurement unit 16. The driver 12 energizes the coil 8 on the basis of the instruction, drives the linear motor made up of the movable and stationary elements 5 and 7, and precisely aligns the wafer 1 as an object to be aligned. At the same time, the controller 11 sends to the cooling amount control unit 13 data about driving of the linear motor such as the energization amount to each coil 8. The cooling amount control unit 13 calculates the heat amount generated by each linear motor in advance or real time on the basis of the data about the driving of the linear motor that is received from the controller 11, and the unit 13 controls the Peltier element 20 and cooling unit 17. Further, the cooling amount control unit 13 instructs the cooling unit 17 to control the temperature or flow rate of the coolant 19 so as to minimize temperature changes of the stationary element 7 and top plate 3 with reference to temperature data received from the temperature measurement unit 15 for outputting temperature data of heat generated by the coil 8 that is measured by the temperature sensor 14 attached to each stationary element 7. A supplied current or voltage is controlled for each Peltier element 20 attached to a corresponding stationary element 7 on the basis of the temperature data or the heat amount calculated in advance or real time by the cooling amount control unit 13. The Peltier element 20 controls the temperature by moving heat from the stationary element 7 at a high speed and high precision. At the same time, the coolant 19 temperature-managed by the cooling unit 17 is supplied to the stationary elements 7 of the respective linear motors via the coolant pipe 18 at an adjusted temperature or flow rate, and absorbs heat generated by the coil 8. The coolant 19 having passed through the linear motors is recovered at once by the cooling unit 17. At this time, each Peltier element 20 can control heat movement at a high speed and high precision by changing a supplied current or voltage, and can control the temperature of a corresponding stationary element 7 at a high precision. This enables fine temperature control of each stationary element 7 that cannot be achieved by only the coolant 19, and can compensate for a temperature control lag of the coolant 19. Especially, the cooling amount control unit 13 predicts heat generated by each stationary element 7 based on an output from the controller 11, and controls the Peltier element 20 based on the result, thereby controlling heat movement by the Peltier element 20 in real time with driving of the fine alignment stage.

The first embodiment adopts a coolant channel 18a in the base member 9 to flow the coolant 19 into the coolant channel 18a and to keep the temperature constant to some extent in order to suppress heat movement between the base member 9 and the stationary element 7, heat generated by the Peltier element 20 itself, heat conduction from another portion, or the influence on another portion by a temperature change of the base member 9 caused by heat conduction. When the coolant 19 flowing through the stationary element 7 can recover most of the heat and heat hardly moves via the Peltier element 20, a temperature change of the base member 9 is small, the influence on the alignment precision by deformation or a temperature change of the base member 9 is relatively small in terms of the structure of the fine alignment stage, and thus the coolant channel 18a need not always be formed in the base member 9. In this case, a heat amount supplied to the base member 9 mainly conducts to the atmosphere, which does not pose any problem because of the air-conditioning effect in the exposure apparatus as far as the heat amount is small.

To suppress temperature nonuniformity of the base member 9, the base member 9 is made of a material such as aluminum having a high thermal conductivity and is designed with a larger heat capacity than that of the stationary element 7. This can prevent a local temperature rise caused by a heat amount applied from the heating side of the Peltier element 20, and can minimize temperature nonuniformity of the atmosphere.

In general, the Peltier element 20 can control heat movement at a high speed by changing a voltage or current supplied between elements, and can compensate for a temperature control lag of the coolant. The heat amount of the stationary element 7 can be directly controlled by directly attaching the Peltier element 20 to the stationary element 7, so that high-precision temperature control is possible. The cooling amount control unit 13 can predict heat generated by the stationary element 7 on the basis of an output from the controller 11, and can control heat movement by the Peltier element 20 in real time with driving of the fine alignment stage. In this way, the advantages of the Peltier element 20 can be fully exploited.

When the heat amount control point where the Peltier element 20 is installed is distant from the temperature observation point where the temperature sensor 14 is attached, a long time (large time constant) is taken until the temperature changes at the temperature observation point after a change in heat amount is added at the heat amount control point. If an output from the Peltier element 20 is changed after the temperature sensor 14 measures the temperature, a control lag occurs, and the good response of the Peltier element 20 cannot be exploited. To the contrary, when the cooling amount control unit 13 predicts a heat generation amount based on an output from the controller 11 and controls the heat movement amount, like the first embodiment, the heat movement amount can be changed in real time in correspondence with a change in heat generation amount, which enables high-precision temperature control.

The Peltier element 20 can reverse heat movement by reversing the direction of the supplied current. In terms of suppressing a temperature change, the Peltier element 20 can move heat from the stationary element 7 to the base member 9 (i.e., cool the stationary element 7) and can move heat from the base member 9 to the stationary element 7 (i.e., heat the stationary element 7). Since the initial temperature can be freely set, the temperature can be easily controlled in terms of suppressing a temperature change of an object to be temperature-controlled. For example, when heat cannot be completely recovered in maximum heat generation of the linear motor under limitations on the temperature and flow rate of a coolant, a temperature change of the stationary element 7 can be suppressed by moving heat to the base member 9 by the Peltier element 20. It is also possible to set a higher initial temperature of the stationary element 7, so that heat moves from the base member 9 to the stationary element 7 to heat the stationary element 7 when no linear motor generates heat, and that heat movement is inhibited when the linear motor generates heat. This can simplify the structure of the cooling unit 17 and can suppress degradation of alignment precision caused by the cooling unit.

The first embodiment employs both temperature control of the stationary element 7 by the Peltier element 20 and temperature control using the coolant 19 temperature-managed by the cooling unit 17. The temperature of the stationary element 7 is not controlled by only the Peltier element 20 because of a low heat movement efficiency of the Peltier element 20. The Peltier element 20 used in this embodiment generates heat of 3 to 4 W by itself when heat of 10 W is absorbed. That is, the heating side of the Peltier element 20 receives a heat amount 30 to 40% larger than the heat absorption amount on the heat-absorbing side. Generally in a single Peltier element, as the control heat amount increases, the efficiency decreases. Hence, the total heat amount to be recovered increases owing to a low efficiency of the Peltier element 20 when all heat generated by the stationary element 7 is absorbed by the Peltier element 20 and heat on the heating side is recovered by a heat recovery unit such as another cooling unit. As a result, conventional problems such as a larger number of coolant pipes or a thick pipe cannot be solved.

However, only the Peltier element 20 may control the temperature of the linear motor stationary element as long as the influence of an increase in total heat amount caused by heat generation of the Peltier element 20 on the alignment precision of the coolant pipe falls within an allowable range. Alternatively, heat from a plurality of linear motor stationary elements is gathered to one portion (base member) and recovered at once.

<Second Embodiment>

The second embodiment of the present invention will be described with reference to FIGS. 3A and 3B.

Figure 3A:
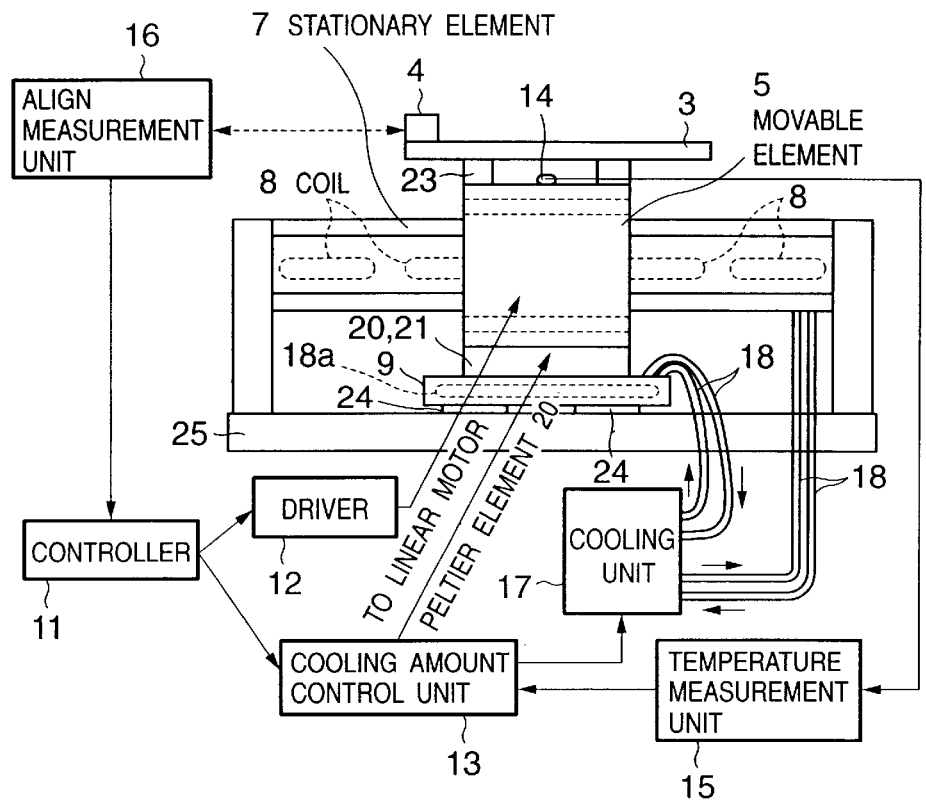
FIG. 3A is a view schematically showing the driving device of a coarse alignment stage in an exposure apparatus according to the second embodiment of the present invention.

FIG. 3A is a view schematically showing the driving device of a uniaxial coarse alignment stage in an exposure apparatus according to the second embodiment of the present invention. FIG. 3B is a sectional view showing the driving device of the uniaxial coarse alignment stage shown in FIG. 3A. In the second embodiment, the same reference numerals as those in the above embodiment denote the same parts.

Figure 3B:
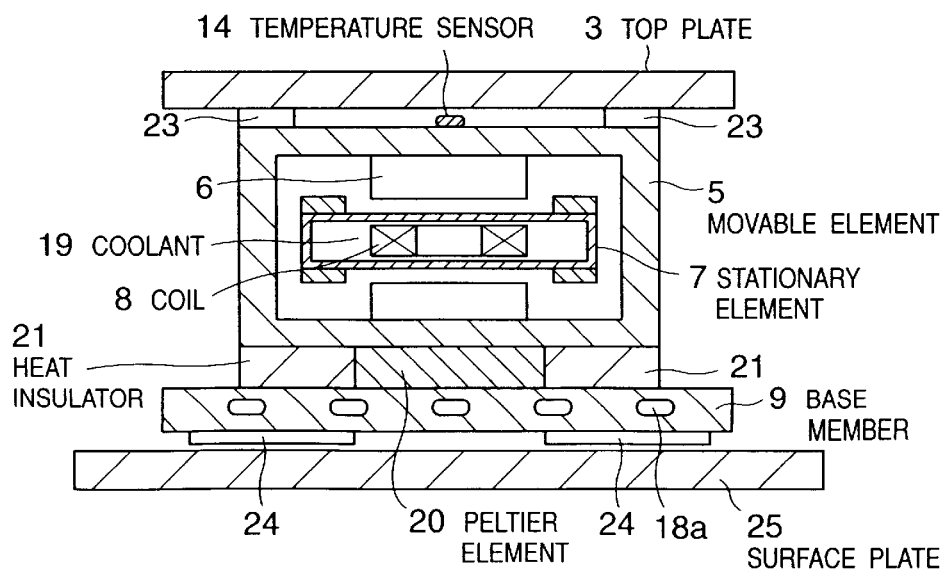
FIG. 3B is a sectional view showing the driving device of the coarse alignment stage shown in FIG. 3A.

In FIGS. 3A and 3B, the uniaxial coarse alignment stage aligns an object to be aligned by performing relative movement by a force generated between a movable element 5 in which permanent magnets 6 are mounted and a stationary element 7 in which coils 8 are buried, in accordance with driving signals from a controller 11 and driver 12. The movable element 5 attached to a top plate 3 via heat insulators 23 is attached to a base member 9 via a Peltier element 20 and heat insulator 21, and guided by hydrostatic bearings 24 along a surface plate 25. The stationary element 7 has a plurality of coils 8 and is constituted by a jacket structure so as to flow a coolant 19 for recovering heat generated by the coils 8.

A mirror 4 is attached to the top plate 3 in order to measure the alignment of the coarse alignment stage, and the alignment of the top plate 3 is measured by an alignment measurement unit 16 such as a laser interferometer fixed to an alignment position where the unit 16 faces the mirror 4. A measurement value from the alignment measurement unit 16 is sent to the controller 11. The controller 11 adjusts the energization amount to the coil 8 of each linear motor via the driver 12 on the basis of the measurement value, controls the linear motor, and drives and aligns the coarse alignment stage.

The temperature and flow rate of the coolant 19 flowing through the jacket of the stationary element 7 are determined by a cooling amount control unit 13 on the basis of outputs from a temperature sensor 14 set on the movable element 5, a temperature measurement unit 15, and the controller 11. The coolant 19 cannot always recover the entire heat amount under limitations on the diameter and allowable temperature of coolant pipes 18. A heat amount which cannot be recovered by the coolant 19 in the jacket conducts to the movable element 5 via the jacket surface and air. To control a temperature change of the movable element 5, a Peltier element 20 is interposed between the movable element 5 and the base member 9. The Peltier element 20 controls the heat movement amount between the movable element 5 and the base member 9. At this time, heat moves not only from the movable element 5 to the base member 9, but also from the base member 9 to the movable element 5 in terms of suppressing a temperature change. That is, the temperature can be kept constant by moving heat from the base member 9 to the movable element 5 when the linear motor generates a small amount of heat, and from the movable element 5 to the base member 9 when the linear motor generates a relatively large amount of heat. Since the Peltier element 20 controls heat movement, heat can be easily moved not only in one direction but also in two directions, unlike another heat moving unit (e.g., cooling using a coolant or a heat pipe). This is very effective because of many temperature change suppression forms. If control of the Peltier element 20 is performed based on an output from the controller 11, the temperature sensor 14 need not always be arranged. Moreover, a sensor-less arrangement can realize high-precision temperature control. The sensor-less arrangement is advantageously free from an increase in cost or decrease in reliability caused by attaching the temperature sensor 14. To execute higher-precision temperature control in the second embodiment, the temperature sensor 14 is set on the movable element 5, and the cooling amount control unit (temperature control unit) 13 refers to an output from the temperature measurement unit 15 as additional information.

In a conventional temperature adjustment apparatus using only a coolant, even if a heat generation amount is predicted based on an output from the controller 11 to control the cooling unit 17 in order to improve the response, an object to be temperature-controlled can only be controlled with very poor response owing to a poor response of the cooling unit 17 and a long coolant pipe 18. To the contrary, the Peltier element 20, which electrically operates, can satisfactorily cope with a rapid change in heat generation amount. By using an instruction from the controller 11, heat can be controlled with a very good response as an entire system. The temperature of an object to be temperature-controlled can be controlled at a high precision to increase the alignment precision of an object to be aligned.

The base member 9 readily changes in temperature because heat is applied/removed to/from the base member 9 by the Peltier element 20, and thus the coolant channel 18a is formed on the base member 9 to flow the coolant 19. This implements suppression of a temperature change and a uniform temperature distribution to a certain degree at which the atmosphere is not influenced. Basically, heat generated by the linear motor is recovered by the coolant 19, and only a heat amount which cannot be covered by temperature control is moved by the Peltier element 20 in order not to excessively apply/remove heat. As far as a temperature change of the base member 9 falls within an allowable range, the coolant is not necessarily supplied.

The jacket which forms the surface of the stationary element 7 is made of ceramics or a resin in order to suppress heat conduction to air as much as possible. The movable element 5 as an object to be temperature-controlled is made of iron or aluminum having a high thermal conductivity. Heat of the stationary element 7 conducts mainly from a portion of the movable element 5 near the stationary element 7. Heat is efficiently moved from the stationary element 7 to the base member 9 by forming, from aluminum or iron having a high thermal conductivity, the entire movable element 5 serving as a main heat path between the main heat conduction portion of the movable element 5 and the Peltier element 20 serving as a heat movement controller.

<Third Embodiment>

The driving device of an alignment stage in an exposure apparatus according to the third embodiment of the present invention will be described with reference to FIG. 4.

Figure 4:
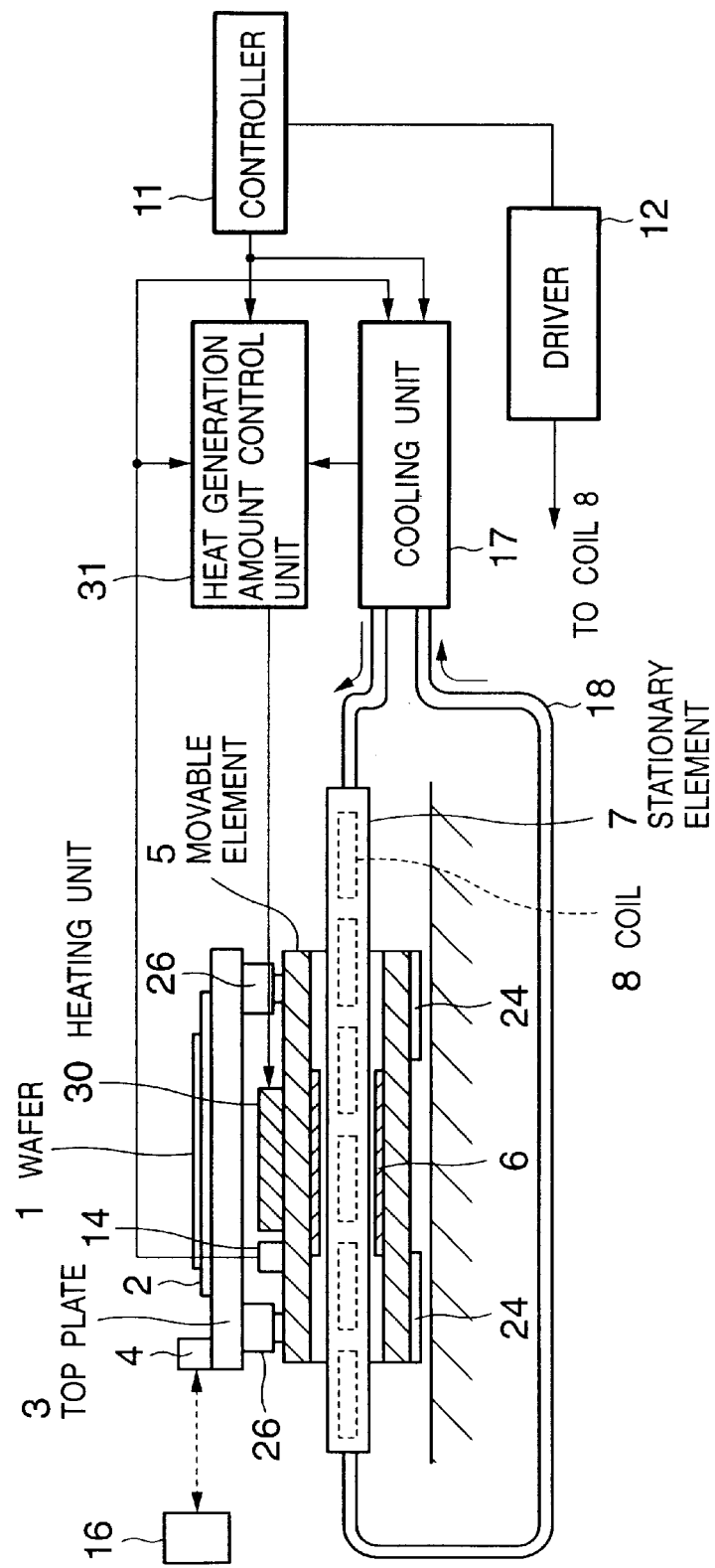
FIG. 4 is a view schematically showing the driving device of an alignment stage in an exposure apparatus according to the third embodiment of the present invention.

FIG. 4 is a view schematically showing the driving device of the alignment stage in the exposure apparatus according to the third embodiment of the present invention.

The third embodiment provides an exposure apparatus equipped with a higher-precision high-reliability temperature adjustment apparatus by constituting a system in which no temperature change occurs during driving of the apparatus and after initialization of the apparatus on the assumption that a temperature rise in the apparatus cannot be avoided to a given degree. In the third embodiment, the same reference numerals as those in the above embodiments denote the same parts, and a detailed description thereof will be omitted.

In FIG. 4, a wafer 1 as a substrate is held by a top plate 3 of the alignment stage via a wafer chuck 2. A pattern formed on a master (not shown) such as a reticle is transferred onto the wafer 1 by irradiation light from an illumination optical unit (not shown) via a projection lens (not shown). The alignment stage aligns the wafer 1 by relatively moving linear motors made up of a movable element 5 in which permanent magnets 6 are mounted and a stationary element 7 in which a plurality of coils 8 are buried, in accordance with a driving signal from a controller 11 and driver 12. The linear motor movable element 5 supports the top plate 3 via linear motors 26 capable of vertical movement, and is guided by hydrostatic bearings 24. The linear motor stationary element 7 has a plurality of coils 8 and is constituted by a jacket structure so as to flow a coolant 19 for recovering an amount of heat generated by the coils 8. A mirror 4 is attached to the top plate 3, and the alignment of the top plate 3 is measured with high precision by an alignment measurement unit 16 such as a laser interferometer fixed to an alignment position where the unit 16 faces the mirror 4.

The coolant 19 temperature-controlled by a cooling unit 17 in order to recover heat generated by the coil 8 of each linear motor is supplied to the stationary element 7 via a coolant pipe 18, and absorbs and recovers heat generated by the coil 8. The movable element 5 is equipped with a heating unit 30 whose heat generation amount is controlled by a heat generation amount control unit 31. The cooling unit 17 and heat generation amount control unit 31 execute control while referring to the driving signal of each coil 8 from the controller 11. On the basis of an output from a temperature sensor 14 set on the movable element 5, the cooling unit 17 controls the temperature and flow rate of the coolant 19, and the heat generation amount control unit 31 controls the heat generation amount of the heating unit 30.

The heat generation amount control unit 31 causes the heating unit 30 to generate a given amount of heat Wo when the linear motor is not driven, i.e., the coil 8 is not energized. This generated heat Wo is an initial heat generation amount, and the initial heat generation amount Wo is set in advance from a heat generation amount which cannot be recovered by the coolant in maximum heat generation of the coil 8, i.e., the difference between the maximum heat amount of the coil 8 and the maximum heat recovery amount of the coolant in the cooling unit.

A temperature which saturates after a sufficient time in a given state is set as a reference temperature To in the driving device under the control of the heat generation amount control unit 31. In the linear motor driving state, the heat generation amount control unit 31 controls and adjusts the heat generation amount of the heating unit 30 so as not to change the temperature of the linear motor movable element 5 from the reference temperature To on the basis of a signal from the controller 11 while considering a heat recovery amount from the cooling unit 17 and a signal from the temperature sensor 14.

In the third embodiment having this arrangement, a heat generation amount which cannot be recovered by the coolant in maximum heat generation of the coil 8 is set in advance as the initial heat generation amount Wo, and the heat generation amount of the heating unit 30 is controlled such that the total of the heat generation amounts of the coil 8 and heating unit 30 is kept constant or the temperature of the temperature sensor 14 set near the heating portion is kept constant. This can suppress temperature changes of the stationary element 7, movable element 5, top plate 3, and atmosphere. At this time, the initial heat generation amount Wo causes a temperature rise of each portion, but the temperature does not change after it stabilizes upon the elapse of a sufficient time. Thus, a measurement device such as a laser interferometer, which is readily influenced by a temperature changes is initialized after the temperature stabilizes. Since the measurement device, which is readily influenced by a temperature change can achieve measurement in an environment where the temperature hardly changes, the measurement precision during exposure operation can be increased. The heating unit 30 in the third embodiment can be a Peltier element as described in the first and second embodiments.

According to a conventional method of recovering heat generated by the coil 8 by using only the coolant temperature-adjusted by the cooling unit 17, the coolant may not be satisfactorily circulated under limitations on the diameter of the coolant pipe 18 or the pump ability of the cooling unit 17. If the coil 8 generates a large amount of heat, the heat cannot be fully recovered and increases the temperatures of the stationary element 7, movable element 5, top plate 3, and atmosphere. To cool a member attached to a movable member, such as the linear motor 26 for vertical movement, the coolant pipe must be deformed in moving the driving device. From the viewpoint of the driving device, an unwanted load acts. This load acts as a disturbance on the driving control apparatus and decreases the alignment precision. If the coolant pipe 18 is made thick, circulation of the coolant is improved to increase the heat recovery efficiency and measurement precision. However, the alignment precision decreases owing to the control unit, which conflicts with the purpose of increasing the alignment precision. To the contrary, the third embodiment can solve these conventional problems. Even if the heat generation amount of each driving portion increases along with an increase in output of the whole exposure apparatus, this embodiment can suppress temperature changes of the apparatus and atmosphere and can suppress decreases in measurement precision and alignment precision caused by a temperature change.

<Fourth Embodiment>

The driving device of an alignment stage in an exposure apparatus according to the fourth embodiment of the present invention will be described with reference to FIG. 5.

Figure 5:
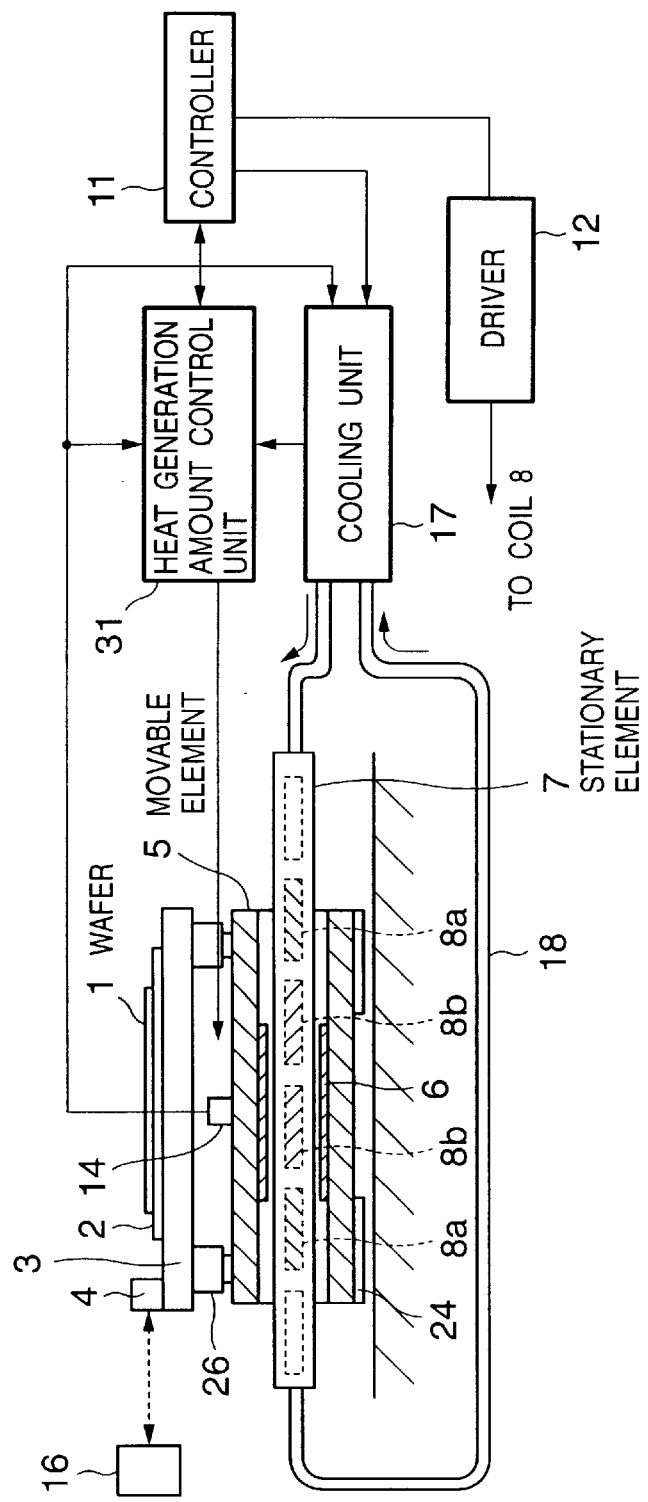
FIG. 5 is a view schematically showing the driving device of an alignment stage in an exposure apparatus according to the fourth embodiment of the present invention.

FIG. 5 is a view schematically showing the driving device of the alignment stage in the exposure apparatus according to the fourth embodiment of the present invention. In the fourth embodiment, the same reference numerals as those in the above-described third embodiment denote the same parts, and a detailed description thereof will be omitted.

The fourth embodiment uses as a heating unit a coil not participating in driving in a linear motor, instead of the heating unit of the third embodiment. More specifically, the fourth embodiment can obtain the same effects as those of the third embodiment by selecting as a heating unit a coil which is not participating in driving in the linear motor and is near a coil participating in driving and serving as a heat source (heating element). The fourth embodiment need not arrange any new heating unit, unlike the third embodiment, but can obtain the same effects as those of third embodiment by only modifying part of a conventional arrangement.

In FIG. 5, when a linear motor movable element 5 is in a state shown in FIG. 5, a coil 8b among a plurality of coils 8 (8a, 8b, . . . ) aligned in a linear motor stationary element 7 is a driving coil used for driving, and the coil 8a is a coil which is not participating in driving and is near the coil 8b serving as a heat source (heating element). Similar to the third embodiment, a heat generation amount control unit 31 controls the heat generation amounts of the coils 8a, 8b, . . . so as not to change the total of the heat generation amounts of the coils 8a and 8b or the temperature at each portion of the apparatus by using the initial heat generation amount Wo as a reference on the basis of outputs from a temperature sensor 14, controller 11, and cooling unit 17. The difference between the maximum heat amount of the coil 8b participating in driving and the maximum heat recovery amount which can be recovered by the cooling unit 17, i.e., a heat generation amount which cannot be recovered by the cooling unit 17 is set as the initial heat generation amount Wo. That is, a heat generation amount which cannot be recovered by the coolant is added in advance as the initial heat generation amount Wo before driving starts. A situation in which the temperature of each portion cannot be controlled is eliminated, and any temperature change of each portion can be prevented.

<Fifth Embodiment>

The driving device of an alignment stage in an exposure apparatus according to the fifth embodiment of the present invention will be described with reference to FIGS. 6 and 7A to 7C.

Figure 7A:
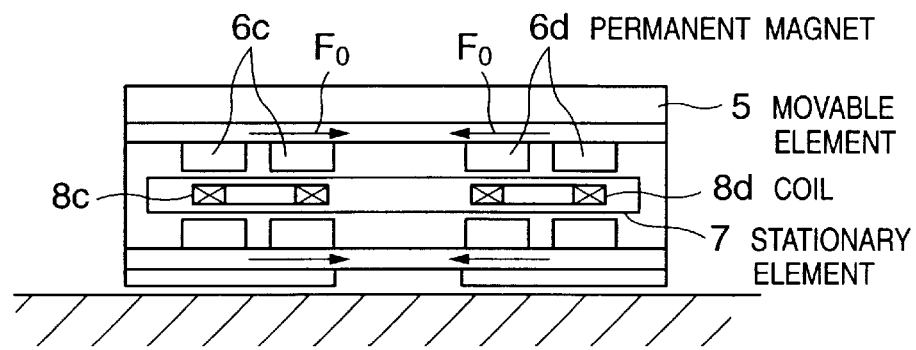
FIGS. 7A to 7C are schematic views for explaining the driving force generation state of each linear motor in an exposure apparatus according to the fifth embodiment of the present invention.
Figure 7B:
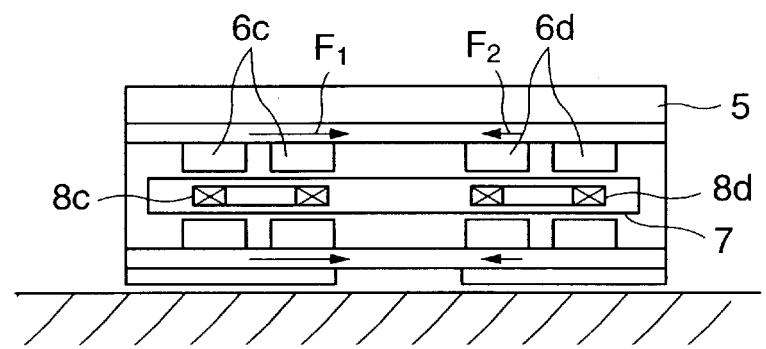
Figure 7C:
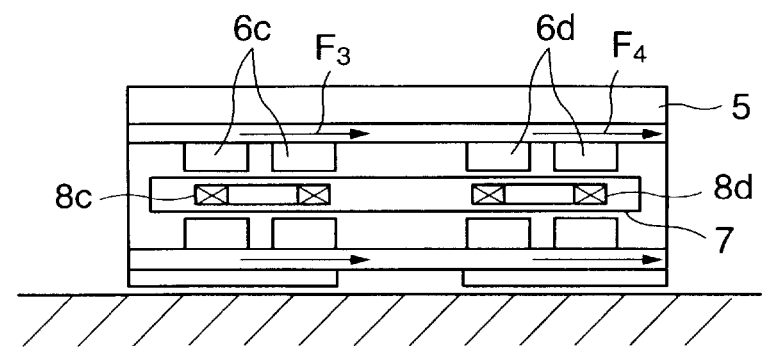

FIG. 6 is a view schematically showing the driving device of the alignment stage in the exposure apparatus according to the fifth embodiment of the present invention. FIGS. 7A to 7C are schematic views for explaining the driving force generation state of each linear motor in the fifth embodiment.

The fifth embodiment uses a driving unit itself as a heating unit by modifying the arrangement of the driving unit. In the fifth embodiment, the same reference numerals as those in the third and fourth embodiments denote the same parts, and a detailed description thereof will be omitted.

In the fifth embodiment, a driving device shown in FIG. 6 has only a small driving range. Unlike the third and fourth embodiments, a plurality of coils 8 are not arranged, or coils to which a current is supplied are not switched. The driving device is constituted by two pairs of linear motors respectively made up of magnets 6c and 6d and coils 8c and 8d which enable driving in the right-and-left direction in FIG. 6.

Since the driving device is constructed by actuators redundant in number with respect to a given degree of freedom, they generate opposite forces to cancel their forces by each other. Even if no force acts in the entire driving device, a state in which each actuator generates a force, i.e., a state in which a current is supplied can be created. In other words, the heat generation amount can also be arbitrarily adjusted together with the magnitude of force in the overall driving device.

An example of a method of adjusting the driving force and heat generation amount of each actuator will be explained with reference to FIGS. 7A to 7C.

FIG. 7A shows the driving forces of linear motors respectively made up of pairs of coils 8c and 8d and magnets 6c and 6d when the driving device does not require any driving force. The left linear motor in FIG. 7A made up of the coil 8c and magnet 6c receives a current so as to generate a predetermined driving force $F_0$. At the same time, the right linear motor in FIG. 7A made up of the coil 8d and magnet 6d receives a current so as to generate a driving force $F_0$ which is in an opposite direction to the force of the left linear motor in FIG. 7A and is equal in magnitude.

The magnitude of the driving force is set and controlled such that the total of the heat generation amounts of the two linear motors becomes equal to the initial heat generation amount Wo as described in the fourth embodiment. The driving forces of the right and left linear motors cancel each other, no driving force acts in the driving device, but heat can be generated by the preset initial heat generation amount Wo.

FIG. 7B shows the states of the linear motors when the driving device requires a small driving force. To cause the driving device to generate a driving force in the right direction in FIG. 7B, a driving force $F_1$ is set larger in the left linear motor in comparison with the state of FIG. 7A, and a driving force $F_2$ is set smaller in the right linear motor. With this setting, the resultant force of the two linear motors acts in the right direction in FIG. 7B, and the driving device moves to the right.

The total heat generation amount of the driving device is controlled to the preset initial heat generation amount Wo and is equal to the state of FIG. 7A.

FIG. 7C shows the states of the linear motors when the driving device requires a large driving force. To cause the driving force to generate a large driving force in the right direction in FIG. 7C, both the right and left linear motors generate driving forces $F_3$ and $F_4$ in the right direction. At this time, even if the total heat generation amount of the driving device exceeds the initial heat generation amount Wo, heat is recovered by the coolant of a cooling unit 17, and a heat generation amount control unit 31 controls the heat generation amount of the heating unit to θ zero. The temperature of each portion rises upon a change in total heat generation amount, which is not a problem because the initial heat generation amount Wo is set such that even the largest total heat generation amount falls within the allowable temperature range in exposure.

As described above, since the driving device is comprised of actuators redundant in number with respect to a given degree of freedom in the fifth embodiment, a large driving force can be generated by canceling their driving forces by each other or combining their driving forces. The driving force can be adjusted while the heat generation amounts of all the actuators are adjusted. In the fifth embodiment, the driving device can serve as a heating unit. This eliminates the need for arranging a new heating unit and is very advantageous in installation space and cost.

To cool most of the heating elements very sensitive to a temperature change, like an exposure apparatus, the driving device is constituted by not one actuator but two or more actuators for a certain degree of freedom. In this case, the cooling efficiency increases, which is also advantageous in terms of cooling.

<Sixth Embodiment>

Figure 8:
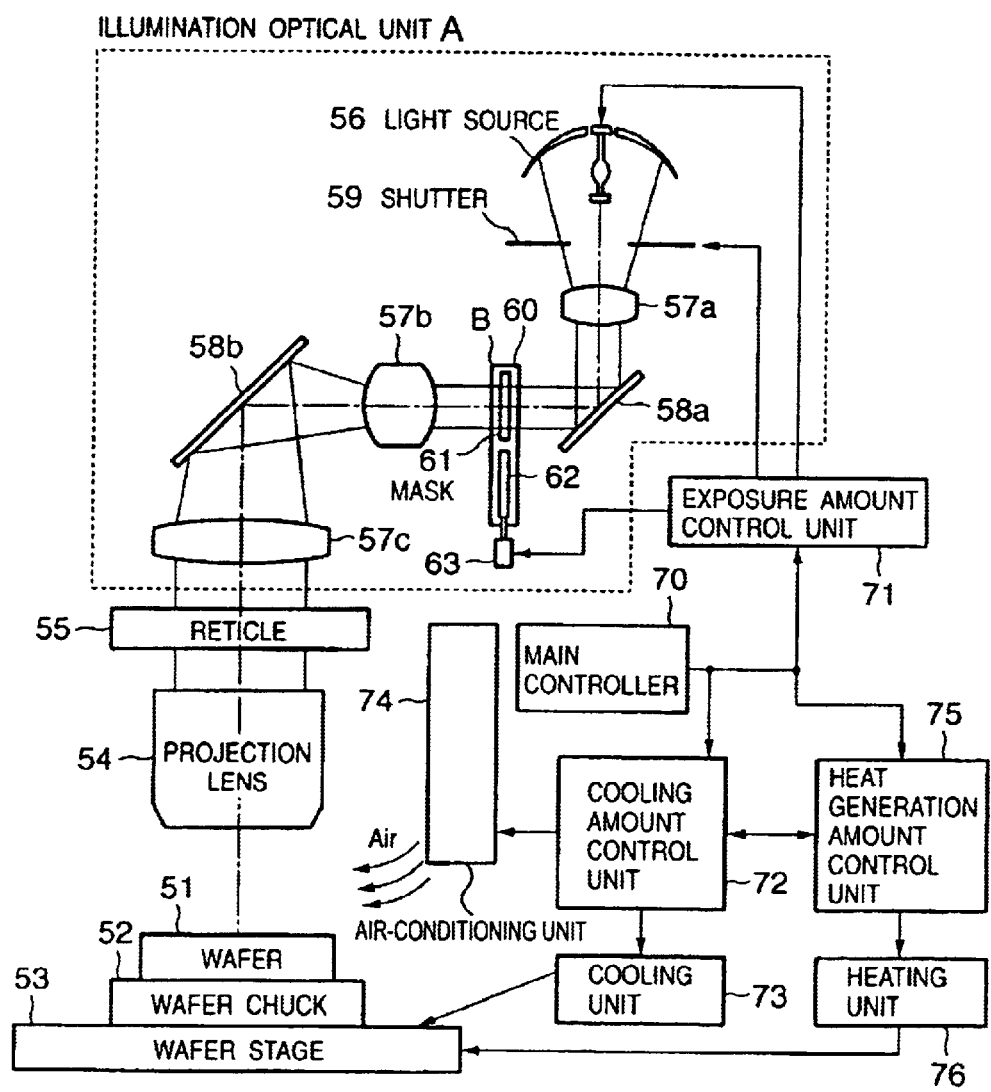
FIG. 8 is a view schematically showing an exposure apparatus according to the sixth embodiment of the present invention.

The sixth embodiment of the present invention will be described with reference to FIG. 8. FIG. 8 is a view schematically showing an exposure apparatus according to the sixth embodiment of the present invention.

In FIG. 8, reference numeral 53 denotes a wafer stages which supports a wafer 51 and aligns it. The wafer stage 53 can move a wafer chuck 52 and the wafer 51 chucked and held by the wafer chuck 52 along a plane perpendicular to the optical axis of a projection lens 54. The wafer stage 53 can obtain its alignment coordinates by a general method, and its movement is controlled by a designated amount. A reticle 55 held by a reticle holder (not shown) is set above the projection lens 54. When an illumination optical unit A above the reticle 55 emits light, a pattern formed on the reticle 55 is transferred to the surface of the wafer 51 via the projection lens 54.

The illumination optical unit A comprises first, second, and third condenser lenses 57a, 57b, and 57c for uniformly irradiating the reticle 55 with light emitted by an extra-high-pressure mercury lamp 56, and first and second mirrors 58a and 58b for deflecting a beam. A shutter 59 controls exposure.

The second and third condenser lenses 57b and 57c and the second mirror 58b are designed to create a plane having a shared imaging relationship with a reticle pattern plane at a portion B shown in FIG. 8. This portion is masked to illuminate only a specific portion of the reticle 55. On the plane B, a pattern exposure mask 61 and alignment mark exposure mask 62 held by a frame 60 are disposed to be selectively inserted in the optical path of a beam, and are switched and driven by a cylinder 63.

The exposure amount and exposure conditions of the illumination optical unit A are controlled by an exposure amount control unit 71 in accordance with a signal from a main controller 70 for controlling the exposure apparatus. The exposure amount control unit 71 operates the light source 56, shutter 59, and masks 61 and 62 in accordance with a signal from the main controller 70, and controls an exposure amount and exposure conditions necessary for the illumination optical unit A.

The wafer 51 receives heat when exposed. This heat is a cause of thermal deformation of the wafer 51. Thermal deformation of the wafer 51 adversely influences the precision of exposure. The internal temperature of the exposure apparatus rises due to heat generated from the heating element of a driving device for driving the wafer stage 53 in order to align the wafer 51. The temperature rise also adversely influences the precision of exposure. To prevent this, a cooling unit 73 is disposed at each heating element portion to recover heat generated from the heating element of the driving device so as to keep the wafer temperature constant on the wafer chuck 52 for holding the wafer 51.

If the internal temperature of the exposure apparatus changes, each member constituting the exposure apparatus thermally deforms, and the optical axis of a laser interferometer (not shown) for measuring the alignment fluctuates to greatly influence the accuracy of exposure. Thus, the cooling unit for keeping the internal atmosphere of the exposure apparatus constant is necessary, and an air-conditioning unit 74 for conditioning air between the projection optical unit and the wafer is arranged.

A cooling amount control unit 72 for controlling the cooling unit 73 and air-conditioning unit 74 calculates the flow rate and temperature of a coolant circulated by the cooling unit 73 and the flow rate and temperature of air supplied by the air-conditioning unit 74, on the basis of a signal supplied from the main controller 70 to the exposure amount control unit 71. Then, the cooling amount control unit 72 outputs signals to the cooling unit 73 and air-conditioning unit 74. Calculation of the cooling amount uses a signal to the exposure amount control unit 71 because a heat amount applied to the wafer 51 and a temperature change inside the exposure apparatus mainly depend on the exposure amount and exposure conditions from the illumination optical unit A.

A heating unit 76 for adding a predetermined initial heat generation amount to the wafer stage 53 is disposed. Similar to the cooling amount control unit 72, a heat generation amount control unit 75 for controlling the heat generation amount of the heating unit 76 on the basis of a signal supplied from the main controller 70 to the exposure amount control unit 71. The heat generation amount control unit 75 is associated with the cooling amount control unit 72. When the capacities of the cooling unit 73 and air-conditioning unit 74 controlled by the cooling amount control unit 72 are not sufficient and the heat generation amount of the driving device or the like is large, the internal temperature of the exposure apparatus changes. In the sixth embodiment, the heating unit 76 applies a predetermined initial heat generation amount to the wafer stage 53 in advance, and as long as the heat generation amount by driving of the wafer stage 53 does not exceed the initial heat generation amount, the heat generation amount control unit 75 controls the total of heat generated by driving of the wafer stage 53 and heat generated by the heating unit 76 to be constant by the initial heat generation amount. When the heat generation amount by driving of the wafer stage 53 exceeds the initial heat generation amount, the heat generation amount control unit 75 controls the heat generation amount of the heating unit 76 to θ zero (no heat). The temperature at each portion of the apparatus rises owing to the initial heat generation amount generated by the heating unit 76. However, the problem is solved by regarding this state as an initial stage and initializing the apparatus.

According to the sixth embodiment having this arrangement, the temperature at each portion of the apparatus is increased by generating heat by the heating unit 76 in advance by a temperature rise of each portion of the apparatus caused by insufficient capacity of the cooling amount control unit 72 for controlling the cooling unit 73 and air-conditioning unit 74. This state is regarded as an initial state, and the apparatus is initialized. Even in driving when a large amount of heat is generated, a temperature rise can fall within a range allowed to perform exposure by the exposure apparatus.

The above-mentioned embodiments have exemplified an exposure apparatus, particularly, the temperature adjustment apparatus of an alignment stage in the exposure apparatus. However, the temperature adjustment apparatus is not limited to applications to the exposure apparatus, but can also be applied to a driving unit mounted on an alignment stage such as the X-Y table of a measurement device or a high-precision processing device, which must achieve precise alignment.

<Application to Production System>

A production system for producing a semiconductor device using the above exposure apparatus will be explained. The production system for producing a semiconductor device (e.g., a semiconductor chip such as an IC or LSI, a liquid crystal panel, a CCD, a thin-film magnetic head, a micromachine, or the like) uses a computer network outside the manufacturing factory to perform a trouble remedy or periodic maintenance of a manufacturing apparatus installed in a semiconductor manufacturing factory, or maintenance service such as software distribution.

Figure 9:
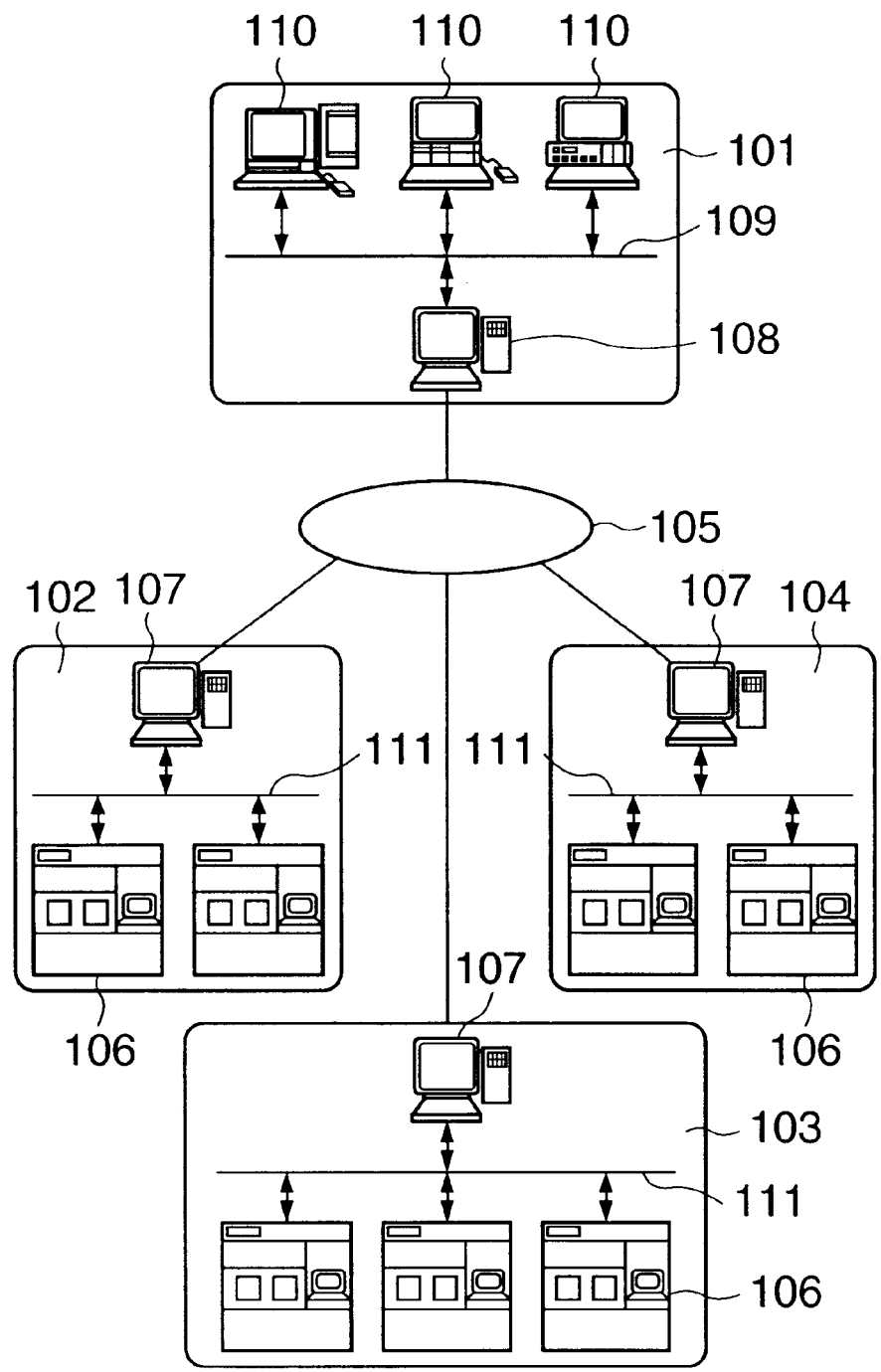
FIG. 9 is a view showing an overall semiconductor device production system.

FIG. 9 shows the overall system cut out at a given angle. In FIG. 9, reference numeral 101 denotes a business office of a vendor (e.g., an apparatus supply manufacturer), which provides a semiconductor device manufacturing apparatus. Assumed examples of the manufacturing apparatus are semiconductor manufacturing apparatuses for performing various processes used in a semiconductor manufacturing factory, such as pre-process apparatuses (e.g., an exposure apparatus, a resist processing apparatus, an annealing apparatus, a film formation apparatus, and the like) and post-process apparatuses (e.g., an assembly apparatus, an inspection apparatus, and the like). The business office 101 comprises a host management system 108 for providing a maintenance database for the manufacturing apparatus, a plurality of operation terminal computers 110, and a LAN (Local Area Network) 109, which connects the host management system 108 and computers 110 to build an intranet. The host management system 108 has a gateway for connecting the LAN 109 to the Internet 105 serving as an external network of the business office, and a security function for limiting external access.

Reference numerals 102 to 104 denote manufacturing factories of the semiconductor manufacturer as users of manufacturing apparatuses. The manufacturing factories 102 to 104 may belong to different manufacturers or the same manufacturer (e.g., a pre-process factory, a post-process factory, and the like). Each of the factories 102 to 104 is equipped with a plurality of manufacturing apparatuses 106, a LAN (Local Area Network) 111, which connects these apparatuses 106 to build an intranet, and a host management system 107 serving as a monitoring apparatus for monitoring the operation status of each manufacturing apparatus 106. The host management system 107 in each of the factories 102 to 104 has a gateway for connecting the LAN 111 in the factory to the Internet 105 serving as an external network of the factory. Each factory can access the host management system 108 of the vendor 101 from the LAN 111 via the Internet 105. The security function of the host management system 108 authorizes access of only a limited user. More specifically, the factory notifies the vendor via the Internet 105 of status information (e.g., the symptom of a manufacturing apparatus in trouble) representing the operation status of each manufacturing apparatus 106. The factory receives, from the vendor, response information (e.g., information designating a remedy against the trouble, or remedy software or data) corresponding to the notification, or maintenance information such as the latest software or help information. Data communication between the factories 102 to 104 and the vendor 101 and data communication via the LAN 111 in each factory adopt a communication protocol (TCP/IP) generally used in the Internet. Instead of using the Internet as an external network of the factory, a dedicated network (e.g., ISDN) having high security, which inhibits access of a third party, can be adopted. Also, the user may construct a database in addition to the one provided by the vendor and set the database on an external network, and the host management system may authorize access to the database from a plurality of user factories.

Figure 10:
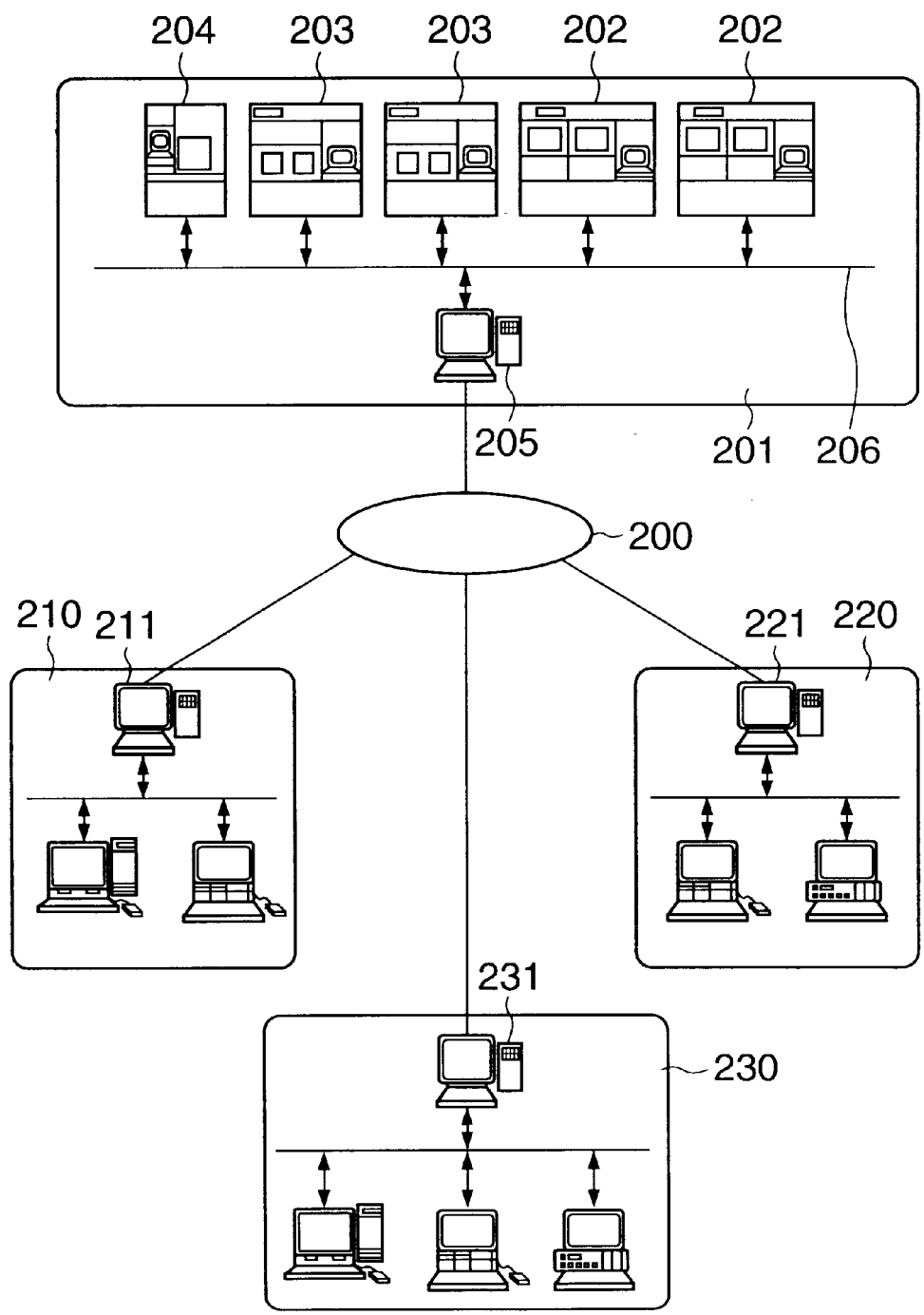
FIG. 10 is a view showing another form of the semiconductor device production system.

FIG. 10 is a view showing the overall semiconductor device production system that is cut out at a different angle from FIG. 9. In the above example, a plurality of user factories having manufacturing apparatuses and the management system of the manufacturing apparatus vendor are connected via an external network, and production management of each factory or information of at least one manufacturing apparatus is communicated via the external network. In the example of FIG. 10, a factory having manufacturing apparatuses of a plurality of vendors, and the management systems of the vendors for these manufacturing apparatuses are connected via the external network of the factory, and maintenance information of each manufacturing apparatus is communicated. In FIG. 10, reference numeral 201 denotes a manufacturing factory of a manufacturing apparatus user (e.g., a semiconductor device manufacturer) where manufacturing apparatuses for performing various processes, e.g., an exposure apparatus 202, a resist processing apparatus 203, and a film formation apparatus 204 are installed in the manufacturing line of the factory. FIG. 10 shows only one manufacturing factory 201, but a plurality of factories are networked in practice. The respective apparatuses in the factory are connected to a LAN 206 to build an intranet, and a host management system 205 manages the operation of the manufacturing line. The business office of vendors (e.g., apparatus supply manufacturers), such as an exposure apparatus manufacturer 210, a resist processing apparatus manufacturer 220, and a film formation apparatus manufacturer 230 comprise host management systems 211, 221, and 231 for executing remote maintenance for the supplied apparatuses. Each host management system has a maintenance database and a gateway for an external system 205 for managing the apparatuses in the manufacturing factory of the user, and the management systems 211, 221, and 231 of the vendors for the respective apparatuses are connected via the Internet or dedicated network serving as an external network 200. If trouble occurs in any one of a series of manufacturing apparatuses along the manufacturing line in this system, the operation of the manufacturing line stops. This trouble can be quickly solved by remote maintenance from the vendor of the apparatus in trouble via the external network 200. This can minimize the stoppage of the manufacturing line.

Each manufacturing apparatus in the semiconductor manufacturing factory comprises a display, a network interface, and a computer for executing network access software and apparatus operating software, which are stored in a storage device. The storage device is a built-in memory, hard disk, or network file server. The network access software includes a dedicated or general-purpose web browser, and provides a user interface having a window as shown in FIG. 11 on the display. While referring to this window, the operator who manages manufacturing apparatuses in each factory inputs, in input items on the windows, pieces of information such as the type of manufacturing apparatus (401), serial number (402), occurrence date and subject of trouble (403), degree of urgency of trouble (405), symptom (406), remedy (407), and progress (408). The pieces of input information are transmitted to the maintenance database via the Internet, and appropriate maintenance information is sent back from the maintenance database and displayed on the display. The user interface provided by the web browser realizes hyperlink functions (410 to 412), as shown in FIG. 11. This allows the operator to access detailed information of each item, receive the latest-version software to be used for a manufacturing apparatus from a software library provided by a vendor, and receive an operation guide (help information) as a reference for the operator in the factory.

A semiconductor device manufacturing process using the above-described production system will be explained.

Figure 12:
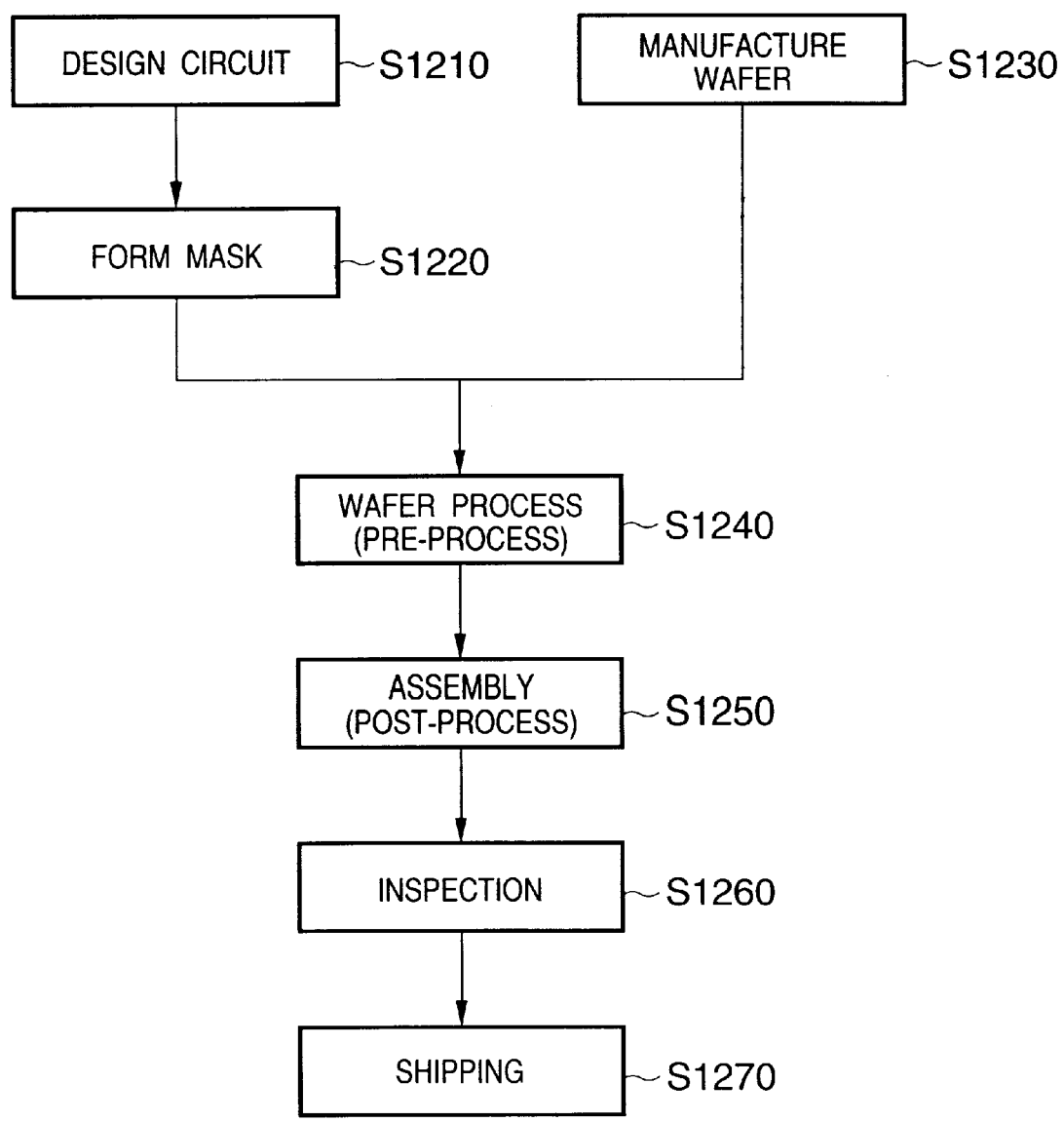
FIG. 12 is a flow chart showing a semiconductor device manufacturing process.

FIG. 12 shows the whole manufacturing flow of the semiconductor device. In step 1210 (circuit design), a semiconductor device pattern is designed. In step 1220 (mask formation), a mask having the designed pattern is formed. In step 1230 (wafer manufacture), a wafer is manufactured using a material such as silicon. In step 1240 (wafer process), called a pre-process, an actual circuit is formed on the wafer by lithography using the prepared mask and wafer. Step 1250 (assembly), called a post-process, is the step of forming a semiconductor chip by using the wafer manufactured in step 1240, and includes an assembly process (dicing and bonding) and a packaging process (chip encapsulation). In step 1260 (inspection), inspections such as the operation confirmation test and durability test of the semiconductor device manufactured in step 1250 are conducted.

After these steps, the semiconductor device is completed and shipped (step 1270). The pre-process and post-process are performed in separate dedicated factories, and maintenance is done for each of the factories by the above-described remote maintenance system. Information for production management and apparatus maintenance is communicated between the pre-process factory and the post-process factory via the Internet or dedicated network.

Figure 13:
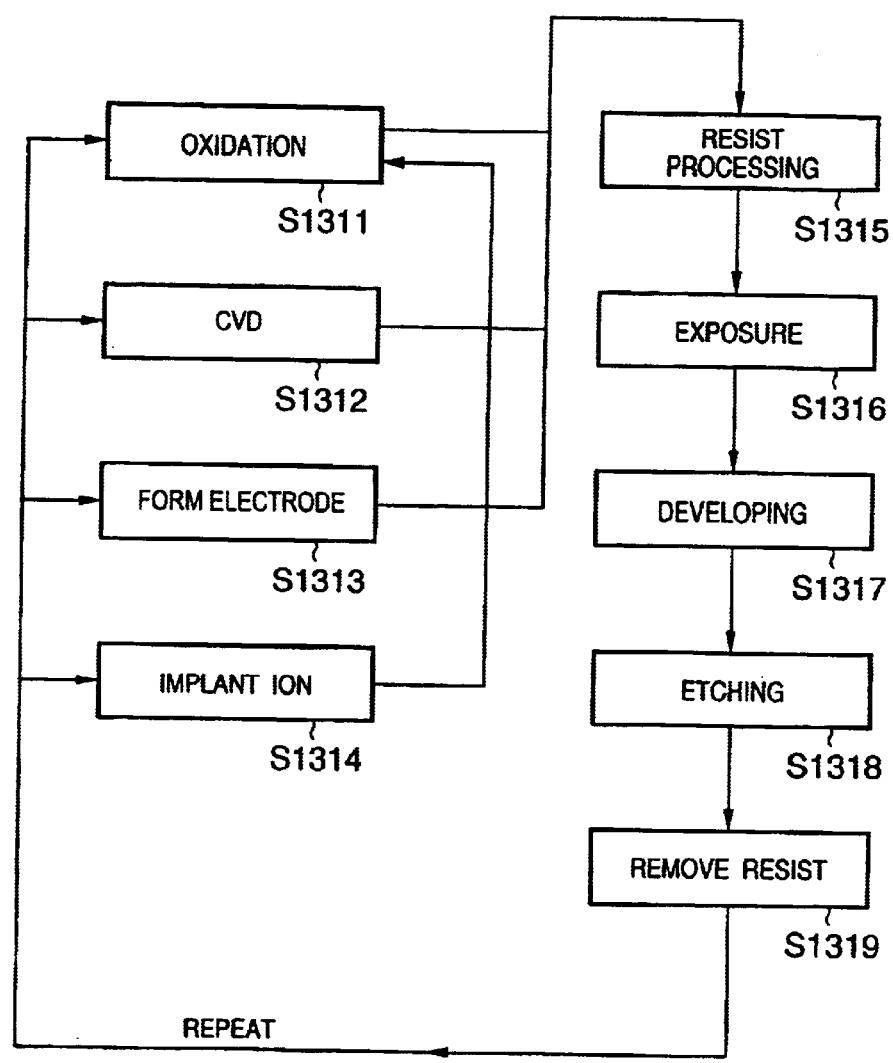
FIG. 13 is a flow chart showing a wafer process.
Figure 14:
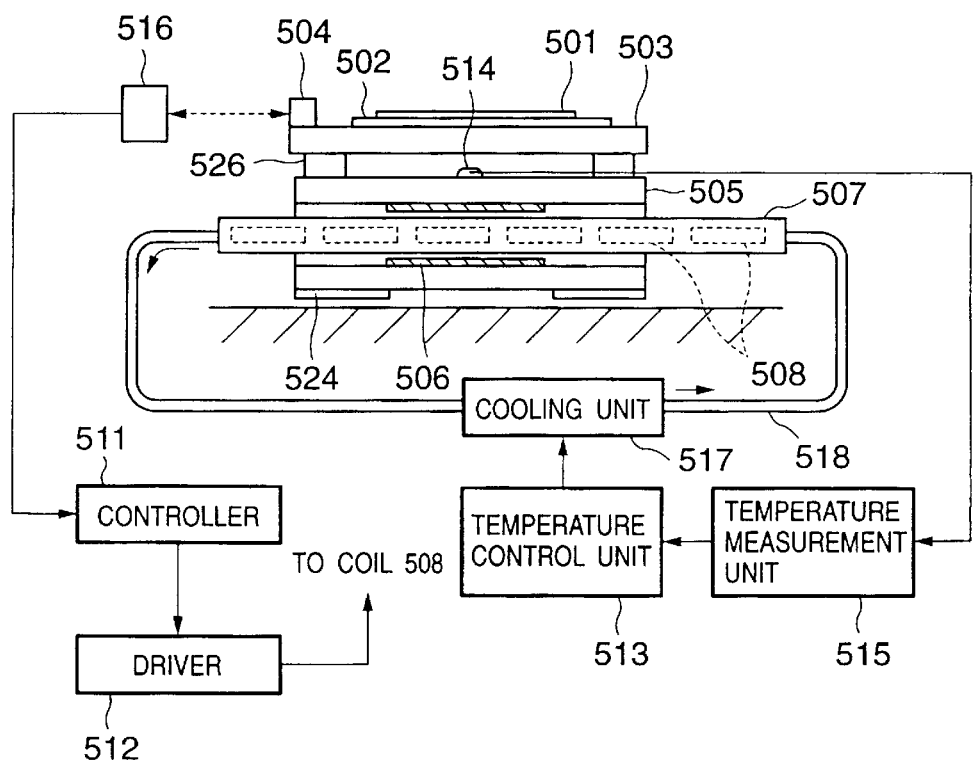
FIG. 14 is a view schematically showing the driving device of an alignment stage in a conventional exposure apparatus.

FIG. 13 shows the detailed flow of the wafer process. In step 1311 (oxidation), the wafer surface is oxidized. In step 1312 (CVD), an insulating film is formed on the wafer surface. In step 1313 (electrode formation), an electrode is formed on the wafer by vapor deposition. In step 1314 (ion implantation), ions are implanted in the wafer. In step 1315 (resist processing), a photosensitive agent is applied to the wafer. In step 1316 (exposure), the above-mentioned exposure apparatus exposes the wafer to the circuit pattern of a mask. In step 1317 (developing), the exposed wafer is developed. In step 1318 (etching), the resist is etched except for the developed resist image. In step 1319 (resist removal), an unnecessary resist after etching is removed. These steps are repeated to form multiple circuit patterns on the wafer. A manufacturing apparatus used in each step undergoes maintenance by the remote maintenance system, which prevents trouble in advance. Even if trouble occurs, the manufacturing apparatus can be quickly recovered. The productivity of the semiconductor device can be increased in comparison with the prior art.

As has been described above, according to the present invention, a Peltier element near an object to be temperature-controlled is controlled based on exposure operation of an exposure apparatus or the like. This enables heat movement control with good responses with respect to exposure operation, and enables high-precision temperature control which cannot be achieved by the prior art. Since a temperature sensor need not always be employed, a low-cost exposure apparatus with high stability can be realized. Further, decreases in measurement precision and alignment precision by a temperature change can be suppressed.

A heat recovery unit is arranged near the object to be temperature-controlled. A heat movement amount controlled by the Peltier element can be reduced, the control efficiency of the Peltier element can be increased, and heat generated by the Peltier element itself can be suppressed to be small. As a result, an increase in total heat amount to be recovered can be suppressed.

The heat conduction path between the Peltier element and a heating element is made of a material having a high thermal conductivity. Hence, the heat movement amount between the Peltier element and the heating element can be increased, and the heat amount of the object to be temperature-controlled can be efficiently controlled. A base member is made of a material having a high thermal conductivity or large heat capacity, so that a heat amount from the object to be temperature-controlled can suppress temperature nonuniformity or a temperature rise of the base member.

The heat generation amount of a heating unit near the object to be temperature-controlled is controlled. Thus, a change in the heat generation amount of the object to be temperature-controlled can be reduced to reduce a change in temperature at each portion of the apparatus and a change in ambient temperature. The heating unit is set near a heating element for the object to be temperature-controlled. The heating unit can give influence equal to the influence of the heating element of the driving device on another portion, which facilitates temperature control of each portion of the apparatus.

In general, many heating units can be electrically controlled with high responses and realize higher-precision temperature control.

When a linear motor having a plurality of coils is used as a stage driving unit, a coil not participating in an exposure operation is used as a heating unit, and no new heating unit need be arranged. Moreover, two or more driving units are arranged in one driving direction, and the driving force and heat generation amount in this driving direction are arbitrarily changed. With this arrangement, each driving unit can be used as a heating unit, and no new heating unit need be arranged, which is advantageous in terms of installation space and cost.

The heat recovery unit is adopted together with control of the heat generation amount of the heating unit. Even if the heat generation amount of each driving portion increases along with an increase in output from the entire apparatus, temperature changes of the apparatus and atmosphere can be suppressed. A temperature change can be controlled at a relatively low temperature, and decreases in measurement precision and alignment precision by a temperature change can be suppressed.

The heat generation amount of the heating unit is controlled on the basis of exposure operation of the exposure apparatus and a heat generation amount recovered by the heat recovery unit. The heating state of the apparatus can be accurately grasped, so that the heat generation amount can be appropriately controlled. By predicting a temperature rise of each portion of the apparatus on the basis of various pieces of information, a proper heat generation amount can be applied to the heating unit, and temperature control can be minimized. By reflecting the detection result of the temperature at each portion of the apparatus on the heating unit, higher-precision control of a temperature change can be achieved.

As many apparently widely different embodiments of the present invention can be made without departing from the spirit and scope thereof, it is to be understood that the invention is not limited to the specific embodiments thereof except as defined in the claims.

What is claimed is:

1. A temperature adjustment apparatus for adjusting a temperature of an object to be temperature-controlled, said apparatus comprising:

a first temperature adjustment mechanism for controlling the temperature of the object to be temperature-controlled, directly, with a fine temperature control response; and a second temperature adjustment mechanism for controlling the temperature of the object to be temperature-controlled, directly, with a coarse temperature control response;

a controller for controlling at least one of the first temperature adjustment mechanism and the second temperature adjustment mechanism, based on a temperature measurement result of the object, wherein said first and second temperature adjustment mechanisms have different temperature control responses, and said controller controls the temperature of the object to be temperature-controlled in cooperation with coarse adjustment and fine adjustment, on the basis of a difference between the temperature control responses, and wherein the object to be temperature-controlled by the first temperature adjustment mechanism and the object to be temperature-controlled by the second temperature adjustment mechanism, are identical.

2. The apparatus according to claim 1, wherein the object to be temperature-controlled includes an actuator or a member near the actuator.

3. The apparatus according to claim 1, wherein the object to be temperature-controlled includes a plurality of objects to be temperature-controlled.

4. The apparatus according to claim 3, wherein said second temperature adjustment mechanism serially connects the plurality of objects to be temperature-controlled and adjusts temperatures.

5. The apparatus according to claim 3, wherein said second temperature adjustment mechanism adjusts, in parallel, temperature of the plurality of objects to be temperature-controlled.

6. The apparatus according to claim 1, wherein said first temperature adjustment mechanism controls the temperature of the object to be temperature-controlled on the basis of a prediction of the temperature of the object to be temperature-controlled.

7. The apparatus according to claim 6, wherein the object to be temperature-controlled generates heat.

8. The apparatus according to claim 6, wherein said first temperature adjustment mechanism controls the temperature of the object to be temperature-controlled on the basis of a prediction of the temperature of the object, and the first temperature control response of said first temperature adjustment mechanism is higher than the second temperature control response of said second temperature adjustment mechanism.

9. The apparatus according to claim 1, wherein said second temperature adjustment mechanism comprises a Peltier element arranged at or near the object to be temperature-controlled.

10. The apparatus according to claim 1, wherein said second temperature adjustment mechanism recovers heat of the object to be temperature-controlled by using a coolant temperature-controlled by a cooling unit.

11. The apparatus according to claim 1, wherein said first temperature adjustment mechanism comprises a third temperature adjustment mechanism for adjusting a temperature of a heat exhaust portion.

12. A apparatus according to claim 11, wherein said third temperature adjustment mechanism serves as part of said second temperature adjustment mechanism.

13. An alignment stage apparatus comprising:

a first temperature adjustment mechanism for controlling a temperature of an object to be temperature-controlled, directly, with a fine temperature control response;

a second temperature adjustment mechanism for controlling the temperature of the object to be temperature-controlled, directly, with a coarse temperature control response, said first and second temperature adjustment mechanisms having different temperature control responses; and a controller for controlling at least one of the first temperature adjustment mechanism and the second temperature adjustment mechanism, which controls the temperature of the object to be temperature-controlled in cooperation with coarse adjustment and fine adjustment, on the basis of a difference between the temperature control responses, and drives the alignment stage by using information about the temperature control as one piece of information for performing driving control, wherein the object to be temperature-controlled by the first temperature adjustment mechanism and the object to be temperature-controlled by the second temperature adjustment mechanism, are identical.

14. The apparatus according to claim 13, wherein the object to be temperature-controlled includes an actuator or a member near the actuator.

15. The apparatus according to claim 13, wherein the object to be temperature-controlled includes a plurality of objects to be temperature-controlled.

16. The apparatus according to claim 15, wherein said second temperature adjustment mechanism serially connects the plurality of objects to be temperature-controlled and adjusts temperatures.

17. The apparatus according to claim 15, wherein said second temperature adjustment mechanism adjusts, in parallel, temperatures of the plurality of objects to be temperature-controlled.

18. The apparatus according to claim 13, wherein said first temperature adjustment mechanism controls the temperature of the object to be temperature-controlled on the basis of a prediction of the temperature of the object to be temperature-controlled.

19. The apparatus according to claim 18, wherein the object to be temperature-controlled generates heat.

20. The apparatus according to claim 18, wherein said first temperature adjustment mechanism controls the temperature of the object to be temperature-controlled on the basis of a prediction of the temperature of the object, and the first temperature control response of said first temperature adjustment mechanism is higher than the second temperature control response of said second temperature adjustment mechanism.

21. The apparatus according to claim 13, wherein said first temperature adjustment mechanism comprises a Peltier element arranged at or near the object to be temperature-controlled.

22. The apparatus according to claim 13, wherein said second temperature adjustment mechanism recovers heat of the object to be temperature-controlled by using a coolant temperature-controlled by a cooling unit.

23. The apparatus according to claim 13, wherein said first temperature adjustment mechanism comprises a third temperature adjustment mechanism for adjusting a temperature of a heat exhaust portion.

24. The apparatus according to claim 23, wherein said third temperature adjustment mechanism serves as port of said second temperature adjustment mechanism.

25. A temperature adjustment apparatus for adjusting a temperature of an object to be temperature-controlled, said apparatus comprising:

a first temperature adjustment mechanism for controlling the temperature of the object to be temperature-controlled directly with a fine temperature control response;

a second temperature adjustment mechanism for controlling the temperature of the object to be temperature-controlled directly with a coarse temperature control reponse; and a controller for controlling at least one of the first temperature adjustment mechanism and the second temperature adjustment mechanism, based on a temperature measurement result of the object, wherein the object to be temperature-controlled by the first temperature adjustment mechanism and the object to be temperature-controlled by the second temperature adjustment mechanism, are identical, the first and second temperature adjustment mechanisms have different temperature control responses, and control the temperature of the object to be temperature-controlled in cooperation with coarse adjustment and fine adjustment on the basis of a difference between the temperature control responses in accordance with the controlling of the controller, and the second temperature adjustment mechanism controls the temperature of the object and controls the temperature of the first temperature adjustment mechanism.

* * * * *

UNITED STATES PATENT AND TRADEMARK OFFICE
CERTIFICATE OF CORRECTION

PATENT NO. : 6,810,298 B2
DATED : October 26, 2004
INVENTOR(S) : Keiji Emoto

It is certified that error appears in the above-identified patent and that said Letters Patent is hereby corrected as shown below:

Column 3,
Line 49, "high-precise" should read -- highly precise --.

Column 7,
Line 42, "internet" should read -- Internet --.

Column 16,
Line 27, "a driving signal" should read -- driving signals --.

Column 17,
Line 22, "changes" should read -- change, --.

Column 19,
Line 45, "θ" should be deleted.

Column 20,
Line 6, "stages" should read -- stage, --.

Column 21,
Line 35, "θ" should be deleted.

Column 25,
Line 63, "and" should be deleted.
Line 67, "response;" should read -- response; and --.

Column 26,
Line 56, "A" should read -- The --.

UNITED STATES PATENT AND TRADEMARK OFFICE
CERTIFICATE OF CORRECTION

PATENT NO.   : 6,810,298 B2
DATED        : October 26, 2004
INVENTOR(S)  : Keiji Emoto It is certified that error appears in the above-identified patent and that said Letters Patent is hereby corrected as shown below:

<u>Column 28,</u>
Line 10, "port" should read -- part --.
Lines 19 and 23, "controlled directly" should read -- controlled, directly, --.

Signed and Sealed this

Twenty-second Day of March, 2005

JON W. DUDAS
*Director of the United States Patent and Trademark Office*

UNITED STATES PATENT AND TRADEMARK OFFICE
CERTIFICATE OF CORRECTION

PATENT NO. : 6,810,298 B2
DATED : October 26, 2004
INVENTOR(S) : Keiji Emoto

It is certified that error appears in the above-identified patent and that said Letters Patent is hereby corrected as shown below:

Title page,
Item [56], References Cited, U.S. PATENT DOCUMENTS, before the first-listed U.S. patent, please insert
-- 4,066,365 A*      01/1978      Staunton...................356/244 --; before the second-listed U.S. patent, please insert
-- 5,084,671 A*      01/1992      Miyata et al. ..................324/760 --; before the third-listed U.S. patent, please insert
-- 5,231,291 A*      07/1993      Amemiya et al. ................250/443.1 --; before the fifth-listed U.S. patent, please insert
-- 5,603,570 A*      02/1997      Shimizu...................374/100 --; before the sixth-listed U.S. patent, please insert
-- 5,680,428 A*      10/1997      Amemiya et al. ..................378/34 --; before the seventh-listed U.S. patent, please insert the following:
-- 5,864,386 A*      01/1999      Nei...........................355/30
   5,966,940 A*      10/1999      Gower et al. .....................62/3.3
   6,115,107 A*      09/2000      Nishi...........................355/68
   6,387,829 B2      05/2002      Maehashi.......................62/201 --.

Signed and Sealed this

Thirty-first Day of May, 2005

JON W. DUDAS
*Director of the United States Patent and Trademark Office*